US012716924B1

(12) United States Patent
Rofougaran et al.

(10) Patent No.: US 12,716,924 B1
(45) Date of Patent: Aug. 25, 2026

(54) WIRELESS COMMUNICATION DEVICE AND METHOD FOR ENHANCED RESOLUTION SPECTRUM MONITORING

(71) Applicant: PELTBEAM INC., Sherman Oaks, CA (US)

(72) Inventors: Ahmadreza Rofougaran, Newport Beach, CA (US); Mehdi Hatamian, Mission Viejo, CA (US); Shervin Alireza Odabaee, Newport Coast, CA (US); Arman Rofougaran, Newport Beach, CA (US); Milan Rofougaran, Newport Coast, CA (US); Kavian Odabaee, Newport Coast, CA (US)

(73) Assignee: Peltbeam Inc., Sherman Oaks, CA (US)

( * ) Notice: Subject to any disclaimer, the term of this patent is extended or adjusted under 35 U.S.C. 154(b) by 0 days.

(21) Appl. No.: 19/353,826

(22) Filed: Oct. 9, 2025

(51) Int. Cl.
*G01R 23/165* (2006.01)
*H04L 5/00* (2006.01)

(52) U.S. Cl.
CPC .......... *G01R 23/165* (2013.01); *H04L 5/0012* (2013.01)

(58) Field of Classification Search
CPC ............................ G01R 23/165; H04L 5/0012
USPC ........................... 324/500, 600, 76.11, 76.19
See application file for complete search history.

(56) References Cited

U.S. PATENT DOCUMENTS 7,741,830 B2 * 6/2010 Griffault .............. G01R 23/173 324/76.23
2007/0036176 A1 * 2/2007 Quigley ................ H04L 1/0061 370/336
2007/0147479 A1 * 6/2007 Yamasuge ........... H04L 27/2679 375/E1.033
2010/0173586 A1 * 7/2010 McHenry ............. H04W 16/14 455/62
2020/0379024 A1 * 12/2020 Kwak .................. G01R 23/167
2021/0314029 A1 * 10/2021 Notargiacomo ....... H04B 7/024
2022/0095114 A1 * 3/2022 Bishop ................ H04W 12/121
2024/0388937 A1 * 11/2024 Murias ................... H04B 17/23

* cited by examiner

*Primary Examiner* — Huy Q Phan
*Assistant Examiner* — Trung Q Nguyen
(74) *Attorney, Agent, or Firm* — CHIP LAW GROUP

(57) ABSTRACT

A wireless communication device includes one or more antenna arrays that receives RF signals across a plurality of frequency bands. The wireless communication device applies band-specific filtering operation to the received RF signals to obtain filtered RF signals. The wireless communication device converts and digitizes the filtered RF signals to obtain digitized intermediate frequency (IF) signals. The wireless communication device executes a plurality of spectrum measurements for the digitized IF signals. Each spectrum measurement of the plurality of spectrum measurements is based on a different offset frequency of a sequence of offset frequencies. Each spectrum measurement is associated with a first frequency resolution. The processor stores phase coherence information for each spectrum measurement. The processor combines the plurality of spectrum measurements based on the stored phase coherence information to generate a spectrum analysis output with a second frequency resolution that exceeds the first frequency resolution.

20 Claims, 6 Drawing Sheets

WIRELESS COMMUNICATION DEVICE AND METHOD FOR ENHANCED RESOLUTION SPECTRUM MONITORING

CROSS-REFERENCE TO RELATED APPLICATIONS/INCORPORATION BY REFERENCE

None.

FIELD OF TECHNOLOGY

Certain embodiments of the disclosure relate to spectrum analyzers. More specifically, certain embodiments of the disclosure relate to a wireless communication device and a method for enhanced resolution spectrum monitoring.

BACKGROUND

The rapid growth of wireless communication technologies and the increasing demand for high-bandwidth applications have led to significant challenges in the current spectrum management landscape. It is known that radio monitoring is the basis of spectrum management. Spectrum monitoring helps spectrum regulators to plan and use frequencies, avoid incompatible usage, and identify sources of harmful interference. Equipment such as spectrum analyzers are useful tools for analyzing and monitoring radio frequency (RF) signals. These instruments are useful for wireless communications testing, ensuring regulatory compliance, and troubleshooting RF interference. Spectrum analyzers play vital roles in RF design, testing, and electronic circuit development. Conventional spectrum analyzers, while effective to a certain extent, face several limitations. Currently, there are many technical challenges in effective spectrum monitoring and signal analysis across multiple frequency bands in increasingly congested electromagnetic environments. Further, there is a significant cost barrier that prevents widespread deployment of spectrum monitoring systems, particularly in applications requiring multiple monitoring points. For example, high-end analyzers capable of monitoring frequencies up to 80+ GHz can cost between $1-2 million per unit, with even lower frequency models (4-5 GHz) ranging from $15,000-50,000.

Current spectrum analysis solutions generally fall into two categories: swept analyzers and real-time analyzers. Swept analyzers operate by sequentially scanning frequency ranges, introducing deadtime between sweeps that can miss intermittent signals. Real-time analyzers offer faster acquisition to some extent but require complex and expensive hardware for Fast Fourier Transform (FFT) processing. Both approaches typically demand dedicated hardware for different frequency bands, further increasing system complexity and cost. Such limitations become particularly problematic in modern wireless environments characterized by, for example: (a) increasing spectrum congestion from proliferating wireless devices; (b) growing deployment of autonomous systems requiring reliable communication; (c) need for reliable interference detection and mitigation; (d) requirements for spatial awareness and signal source location; and (e) complex signal environments requiring advanced pattern recognition. With conventional systems, while traditional software-defined radio (SDR) solutions offer more flexibility, they have restricted frequency spans and insufficient processing capability for advanced signal analysis. Additionally, conventional analyzers struggle with limited spatial awareness, making it difficult to locate and characterize signal sources in complex environments. Furthermore, in another example, there are form factor constraints with traditional systems used for spectrum monitoring. Traditional benchtop units require significant space, while portable units sacrifice functionality for mobility.

Further limitations and disadvantages of conventional and traditional approaches will become apparent to one of skill in the art through comparison of such systems with some aspects of the present disclosure as set forth in the remainder of the present application with reference to the drawings.

BRIEF SUMMARY OF THE DISCLOSURE

A wireless communication device and a method for enhanced resolution spectrum monitoring, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE DISCLOSURE

Figure 1:
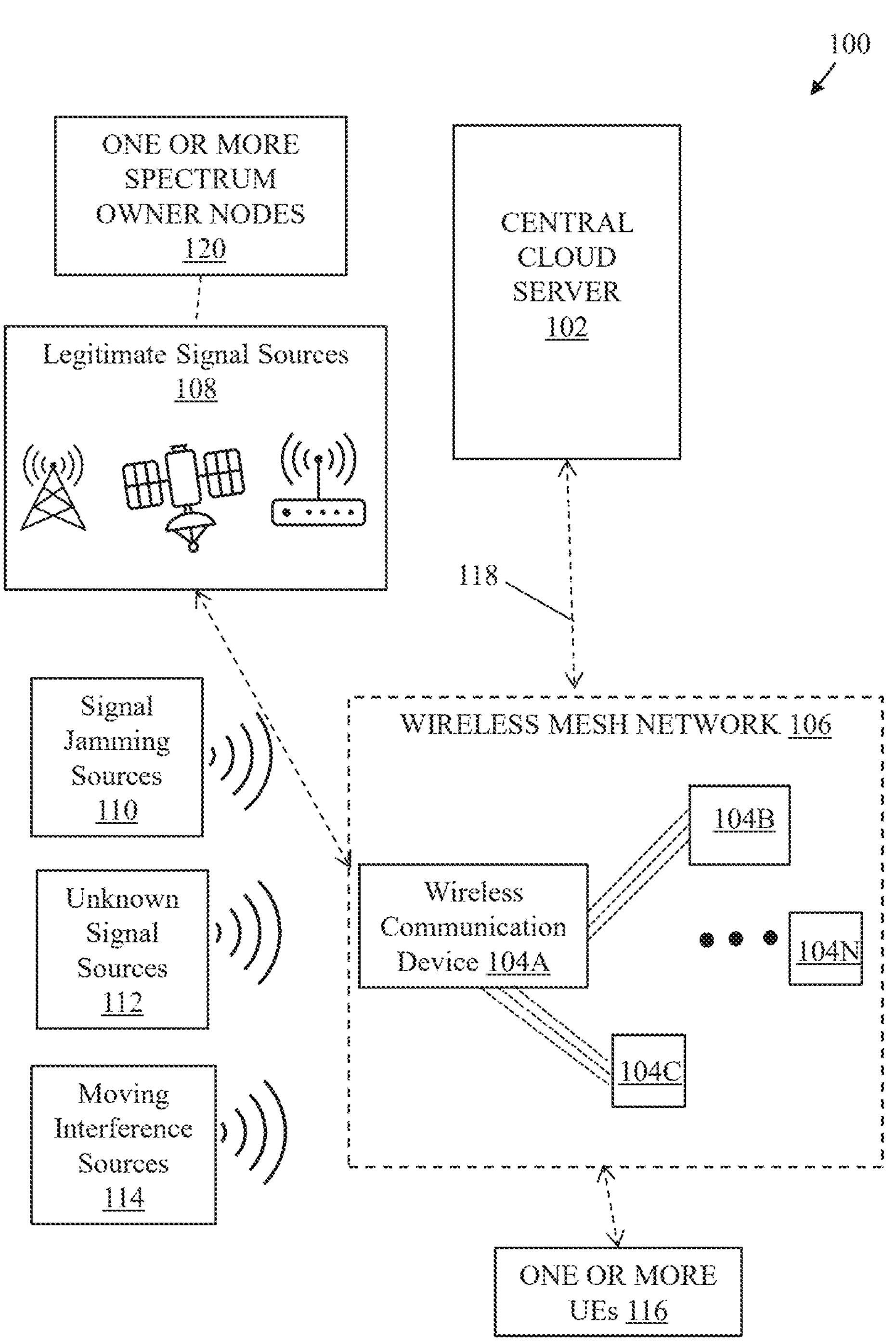
FIG. 1 is a diagram that illustrates an exemplary system for enhanced resolution spectrum monitoring, in accordance with an exemplary embodiment of the disclosure.

Certain embodiments of the disclosure may be found in a wireless communication device and a method for enhanced resolution wideband spectrum monitoring.

Conventional systems manifest hardware complexity, such as multiple dedicated radio frequency (RF) front ends for different frequency bands, expensive analog to digital converters (ADCs) for high-bandwidth signal capture (e.g., >7 GHz), and complex signal processing hardware driving high spectrum analyzer costs. Additionally, conventional devices struggle with limited spatial awareness, making it difficult to locate and characterize signal sources in complex environments. Furthermore, conventional spectrum analysis systems are limited by the fundamental relationship: frequency resolution equals sample rate divided by Fast Fourier Transform (FFT) size. For example, a typical wireless chipset with 320 MHz sample rate and 1024-point FFT achieves only 312.5 kHz resolution. The limited resolution prevents distinguishing narrowband signals separated by less than the resolution bandwidth. For example, two signals spaced 50 kHz apart appear as a single blurred component. Traditional solutions create significant drawbacks as increasing FFT size requires exponentially more processing power, memory, and time while often necessitating custom hardware. On the contrary, reducing sample rate sacrifices bandwidth coverage and causes missed signals. The frequency resolution limitations and the drawbacks of traditional solutions create technical and economic barriers to deploying high-resolution spectrum analysis in enterprise applications, such as wireless infrastructure monitoring, interference detection systems, spectrum compliance verification, and distributed sensor networks requiring commercial-grade wireless chipsets.

Furthermore, in spectrum monitoring, resolution refers to the minimum frequency separation between two signals that a spectrum analyzer can distinguish as distinct signals. The resolution may be a measure of how well the spectrum analyzer can separate closely spaced signals in the frequency domain. Conventional high-resolution spectrum analyzers require expensive specialized hardware components. For example, custom analog-to-digital converters (ADCs) may be required for high-speed sampling rates exceeding multiple giga samples per second. In another example, dedicated digital signal processing (DSP) hardware may be required to perform large-scale Fast Fourier Transform (FFT) operations with large FFT sizes, for example, 16,384 points or greater. The fundamental limitation arises from the relationship between frequency resolution and FFT size. The frequency resolution equals sample rate divided by FFT size. The increase in FFT size exponentially increases computational complexity, memory requirements, and hard ware costs, making high-resolution spectrum analysis prohibitive for widespread deployment in distributed monitoring networks, portable systems, and commercial infrastructure applications.

In contrast to conventional systems that require multiple dedicated RF front ends for different frequency bands, expensive analog-to digital converters (ADCs) for high-bandwidth signal capture (>7 GHz), and complex signal processing hardware driving high spectrum analyzer costs, the disclosed wireless communication device achieves enhanced resolution spectrum monitoring by taking multiple measurements with slightly offset local oscillator (LO) frequencies and combining the multiple measurements coherently. The disclosed wireless communication device achieves a resolution that exceeds the base FFT capability of the conventional Wi-Fi® 7 chipset.

In an example, conventional WLAN chipsets (e.g., Wi-Fi® 7 chipsets) that operate in the 6 GHz band with 320 MHz sample rate and typical 1024-point FFT processing achieve a base frequency resolution of 312.5 kHz (e.g., 320,000,000 Hz (320 MHz) divided by 1024 is equal to 312,500 Hz, i.e., 312.5 kHz). The frequency resolution limitation prevents the WLAN chipset from distinguishing between signals separated by less than 312.5 kHz, causing them to appear as a single blurred spectral component. For example, two narrowband interference signals at 6.1000 GHz and 6.1001 GHz (separated by only 100 kHz) would be detected as one signal because their 100 kHz separation is below the 312.5 kHz resolution threshold, limiting the system's ability to identify and characterize narrowband threats or interference sources critical in security and spectrum monitoring applications. In contrast to the conventional systems, the wireless communication device and method of the present disclosure allows for detailed signal analysis and characterization without requiring larger FFT sizes or custom hardware, improving the system's ability to detect and analyze narrowband signals.

In accordance with an embodiment, the disclosed wireless communication device may be configured to receive RF signals across a plurality of frequency bands. The disclosed wireless communication device may be further configured to apply band-specific filtering operation to the received RF signals to obtain filtered RF signals. The band-specific filtering operation may provide selective frequency isolation while maintaining signal integrity across multiple bands, enabling concurrent spectrum analysis without cross-band interference that degrades measurement accuracy in conventional systems. The disclosed wireless communication device may be further configured to convert the filtered RF signals to one or more intermediate frequencies (IFs) (e.g., 2.4 GHz, 5 GHz, or 6 GHz frequency) and digitize the filtered RF signals at the one or more IFs to obtain digitized IF signals. The disclosed wireless communication device may be further configured to execute a plurality of spectrum measurements for the digitized IF signals. Each spectrum measurement of the plurality of spectrum measurements may be based on a different offset frequency of a sequence of offset frequencies. The disclosed wireless communication device may be further configured to store phase coherence information for each spectrum measurement of the plurality of spectrum measurements. The disclosed wireless communication device may be further configured to combine the plurality of spectrum measurements based on the stored phase coherence information to generate a spectrum analysis output with a second frequency resolution that exceeds the first frequency resolution. The use of different offset frequency may overcome the limitation that frequency resolution equals sample rate divided by FFT size, enabling enhanced resolution without requiring larger FFT processing or custom digital signal processing hardware. The disclosed wireless communication device intelligently employs a local oscillator (LO) drifting operation, which achieves enhanced frequency resolution by exploiting phase relationship information associated with spectrum measurement (e.g., FFT measurements) taken with sequentially offset frequencies. For example, when multiple narrowband signals fall within the same FFT frequency bin, conventional analysis cannot distinguish them due to the fundamental resolution limit of sample rate divided by FFT size. However, by performing multiple measurements with slightly different offset frequencies, each signal may exhibit a unique phase evolution pattern proportional to its frequency offset from the LO frequency. The combining of the plurality of spectrum measurements based on the stored phase coherence information may enable analysis of the phase rotation differences across measurements to decompose the combined signal into individual spectral components and calculate precise frequencies. For example, while a Wi-Fi® 7 chipset with 320 MHz sample rate and 1024-point FFT has a base resolution limitation of 312.5 kHz, the LO drifting operation (e.g. the use of different offset frequency) can distinguish signals separated by significantly less than the base resolution limitation (e.g., the base resolution limitation of 312.5 kHz). Thus, the disclosed wireless communication device may enable detection and characterization of narrowband signals that would otherwise appear as a single blurred component in conventional single-measurement FFT analysis.

FIG. 1 is a diagram that illustrates an exemplary system for enhanced resolution spectrum monitoring, in accordance with an exemplary embodiment of the disclosure. With reference to FIG. 1, there is shown a system 100 for enhanced resolution spectrum monitoring across multiple frequency bands. The system 100 may include a central cloud server 102, a plurality of wireless communication devices, such as wireless communication devices 104A, 104B, 104C, . . . , 104N. In an implementation, the wireless communication devices 104A, 104B, 104C, . . . , 104N may be interconnected with each other in a wireless mesh network 106. In another implementation, each of the wireless communication devices 104A, 104B, 104C, . . . , 104N may function independently as a standalone device for enhanced resolution spectrum monitoring across multiple frequency bands or may work in cooperation with each other for not only enhanced resolution spectrum monitoring across multiple frequency bands but also wireless data communication and routing across the wireless mesh network 106.

There are further shown different types of signal sources, such as legitimate signal sources 108, signal jamming sources 110, unknown signal sources 112, and moving interference sources 114. The legitimate signal sources 108, for example, may be authorized and licensed wireless carrier network frequencies, for example, 4G or 5G signals from base stations or small cells, frequencies used for direct-to-cell service (e.g., satellite-to-cell phone service), or authorized wireless local area network (WLAN) signals (e.g., Wi-Fi® signals), or other legitimate commercial or non-commercial RF signals, as per use case. The legitimate signal sources 108 may be associated with one or more spectrum owner nodes 120. The wireless communication devices 104A, 104B, 104C, . . . , 104N may not be initially aware of the different types of signal sources and may perform RF signal scanning (e.g., airwaves scanning) to detect and identify active signal sources and potential receivers operating on specific frequencies within range. In an implementation, the wireless communication devices 104A, 104B, 104C, . . . , 104N may be further communicatively coupled to the central cloud server 102, via a communication network 118.

The central cloud server 102 includes suitable logic, circuitry, and interfaces that may be configured to communicate with the wireless communication devices 104A, 104B, 104C, . . . , 104N (may also be referred to as network nodes or a mesh nodes). In an implementation, the central cloud server 102 may be communicatively coupled to each network node including one or more user equipment (UEs) 116. In an example, the central cloud server 102 may be a remote management server that is managed by a third party different from the service providers associated with the plurality of different wireless carrier networks (WCNs), service providers or spectrum owners. In another example, the central cloud server 102 may be a remote management server or a data center that is managed by a third party, or jointly managed, or managed in coordination and association with one or more of the plurality of different WCNs or different service providers.

The wireless communication devices 104A, 104B, 104C, . . . , 104N may also be referred to as mesh nodes when connected to each other in the wireless mesh network 106. Each of the wireless communication devices 104A, 104B, 104C, . . . , 104N may be configured to capture and monitor raw RF signals from direct current (DC, i.e. 0 hertz (Hz)) to 300 Gigahertz (GHz) and analyze the captured RF signals. Each of the wireless communication devices 104A, 104B, 104C, . . . , 104N may be a multi-functional device for spectrum-sensing across a plurality of frequency bands (DC to 300 GHz) and for wireless data communication to one or more other wireless communication devices in the wireless mesh network 106. Examples of the wireless communication devices 104A, 104B, 104C, . . . , 104N, may include but are not limited to a wide-range spectrum monitoring device or a special dual-purpose device for spectrum monitoring and wireless data communication, a modified repeater device, or a 5G backplane system. The wireless communication devices 104A, 104B, 104C, . . . , 104N may be portable devices.

The wireless mesh network 106 may be a resilient, high-capacity wireless network that extends the reach of a fiber backbone to provide widespread coverage to end users, such as the one or more UEs 116 via the wireless communication devices 104A, 104B, 104C, . . . , 104N. The fiber backbone (not shown) may be a high-performance, fiber-optic core network infrastructure that connects central offices, data centers, and the wireless mesh network 106. The fiber backbone may aggregate traffic from the central offices and data centers and provide seamless integration between the fiber and wireless network components.

The legitimate signal sources 108 may refer to authorized transmitters operating within licensed frequency bands in compliance with regulatory standards and predetermined protocols. Examples of the legitimate signal sources may include, but not limited to, cellular base stations, small cells, or repeaters, licensed FM/AM radio stations, commercial broadcast transmitters, public safety communications, satellite downlinks, authorized military communications within designated bands (e.g., if that is required in a use case), authorized Wi-Fi® signals, GPS satellites operating at 1575.42 MHz, and licensed point-to-point microwave links, financial trading networks using 70/80 GHz E-band, Broadcast studio-to-transmitter links (STL), for example, at 950 MHz, utility supervisory control and data acquisition (SCADA) networks operating at 4/6 GHz, enterprise building-to-building connections at 60 GHz, public safety backhaul networks at 4.9 GHz, or Internet service provider backbone links). The licensed point-to-point microwave links may include, for example, cellular backhaul links operating at Jun. 11, 2018/23 GHz or other bands.

The signal jamming sources 110 may refer to devices deliberately emitting interference signals designed to disrupt or degrade wireless communications across single or multiple frequency bands. Examples of the signal jamming sources may include, but not limited to, GPS jammers, cellular blockers (e.g., multi-band jammers (GSM/CDMA/3G/4G/5G), frequency hopping cell disruptors, Band-specific blockers (700 MHz/850 MHz/1900 MHz), Smart jammers targeting control channels, or Base station signal overriders), broadband noise generators, targeted frequency disruptors, and pulsed interference systems.

The unknown signal sources 112 may refer to transmitters producing RF emissions that do not conform to known signal characteristics, protocols, or authorized frequency allocations. Examples of the unknown signal sources may include, but not limited to, unidentified transmitters, non-standard modulation signals, encrypted transmissions of unknown origin, sporadic unauthorized emissions, and signals using uncharacterized protocols.

The moving interference sources 114 may refer to mobile entities generating RF interference that change spatial location over time, whether intentional or unintentional. Examples of the moving interference sources may include, but not limited to, vehicles with malfunctioning electronics, mobile jamming platforms, interference-generating drones, vessels with non-compliant radio systems, and portable unauthorized transmitters in motion.

The one or more UEs 116 may correspond to a wireless device, such as a client device or a telecommunication hardware used by an end user to communicate. Some of the one or more UEs 116 may refer to a combination of a mobile equipment and subscriber identity module (SIM). Examples of the one or more UEs 116 may include, but are not limited to a smartphone, a laptop, a desktop machine, a customer premise equipment, a virtual reality headset, an augmented reality device, a wireless modem, a home router, a Wi-Fi® enabled smart television (TV) or set-top box, a VoIP station, or any other customized hardware for wireless communication.

The communication network 118 may refer to the infrastructure and protocols enabling secure data exchange between the wireless communication devices 104A, 104B, 104C, . . . , 104N and the central cloud server 102 through one or more known wireless transmission mediums. Examples of the one or more known wireless transmission mediums may include, but are not limited to, a wireless carrier network, a wide area network (WAN), the Internet, a wireless local area network (WLAN), a wireless personal area network (WPAN), a cellular network, an ad-hoc wireless mesh network, a satellite communication network, a microwave communication link, or a combination thereof.

The one or more spectrum owner nodes 120 may be configured to communicate with the central cloud server 102. The central cloud server 102 may obtain frequency spectrum availability metadata and custom-defined access parameters from the one or more spectrum owner nodes 120. The system 100 may allow spectrum owners to define customized access rules and data routing logic, via the one or more spectrum owner nodes 120. The spectrum owners may specify smart contract rules encoding authorization credentials such as crypto keys for allowing client devices, such as the one or more UEs 116, to dynamically subscribe to and use owned bands or underutilized spectrum.

The various operations of the disclosed system 100 may be explained by taking an example of one wireless communication device, such as the wireless communication device 104A. It is to be understood that operations described for the wireless communication device 104A may be applicable to other wireless communication devices 104B, 104C, . . . , 104N. For example, each of the wireless communication devices 104A, 104B, 104C, . . . , 104N may be configured to perform wideband spectrum monitoring with high sensitivity and dynamic range while intelligently utilizing the processing capabilities of a WLAN chipset (e.g., IEEE 802.11be chipset and modems) modified for signal monitoring with intelligent signal down conversion and signal processing architectures to achieve wide frequency range coverage (DC to 300 GHz) in a cost-effective manner.

Typically, IEEE 802.11be/ax (Wi-Fi® 7/6E) hardware is conventionally designed for high-throughput wireless networking, operating in 2.4 GHz, 5 GHz, and 6 GHz bands. It provides features such multi-link operation (MLO), 320 MHz channels, 4K Quadrature Amplitude Modulation (QAM) modulation, and multi-user Multiple-Input Multiple-Output (MIMO) primarily for data communication between access points and client devices.

The present disclosure intelligently modifies and repurposes IEEE 802.11be/ax hardware beyond its standard networking role by integrating wideband spectrum monitoring capabilities. Typically, IEEE 802.11be/ax hardware can only process frequencies ranging from 1-7 GHz and such IEEE 802.11be/ax hardware are not meant for spectrum monitoring. In an example, the wireless communication device 104A may leverage the hardware's advanced signal processing capabilities while extending frequency coverage from DC to 300 GHz through multi-stage conversion. This adaptation enables concurrent operation as a wireless networking device and a spectrum monitoring platform, utilizing features such as MLO and high-speed signal processing for signal detection, classification, and analysis across a significantly broader range than traditional Wi-Fi® operations. The wireless communication device 104A maintains networking functionality in the system 100 while adding capabilities for detecting different types of signal sources, such as the legitimate signal sources 108, the signal jamming sources 110, the unknown signal sources 112, and the moving interference sources 114.

In an implementation, multiple monitoring nodes, such as the wireless communication devices 104A, 104B, 104C, . . . , 104N, may operate concurrently across different frequency bands. In such a case, each node may perform local analysis, and the data is then sent to a central fusion center, such as the central cloud server 102, for real-time processing and combining. This distributed approach may further allow for enhanced spatial coverage, improved jammer resistance through diversity, and scalable deployment while maintaining high-resolution analysis capabilities.

In an example, a scenario may be considered where a 100 GHz signal needs to be monitored. Conventional spectrum analyzers may require dedicated expensive hardware including specialized ADCs capable of handling >7 GHz bandwidth directly. In contrast, the wireless communication device 104A of the present disclosure may employ a novel multi-stage frequency conversion approach where the 100 GHz signal may be first converted to 15 GHz using an 85 GHz local oscillator generator, with the image frequency at 185 GHz being naturally attenuated. A second conversion stage may utilize a 9 GHz local oscillator generator to convert the 15 GHz signal to 6 GHz, which may then be processed by a WLAN chipset, thereby eliminating the need for expensive specialized hardware while maintaining analysis capabilities. Furthermore, the wireless communication device 104A of the present disclosure employs MLO-based concurrent processing, which enables concurrent monitoring of both 5 GHz and 6 GHz intermediate frequency bands with real-time cross-correlation. For example, when a frequency hopping signal transitions between 5 GHz and 6 GHz bands, the concurrent processing architecture of the system 100 may track and correlate these transitions in real-time, enabling detection of coordinated transmission patterns and improved interference rejection through spatial diversity from MIMO arrays. Such capabilities may otherwise require multiple expensive dedicated instruments in conventional systems while still are mostly ineffective for such wideband spectrum monitoring. Furthermore, the wireless communication device 104A may achieve enhanced resolution without requiring larger FFT sizes, custom digital signal processing hardware, or specialized analog-to-digital converters that exponentially increase system cost and complexity.

Figure 2:
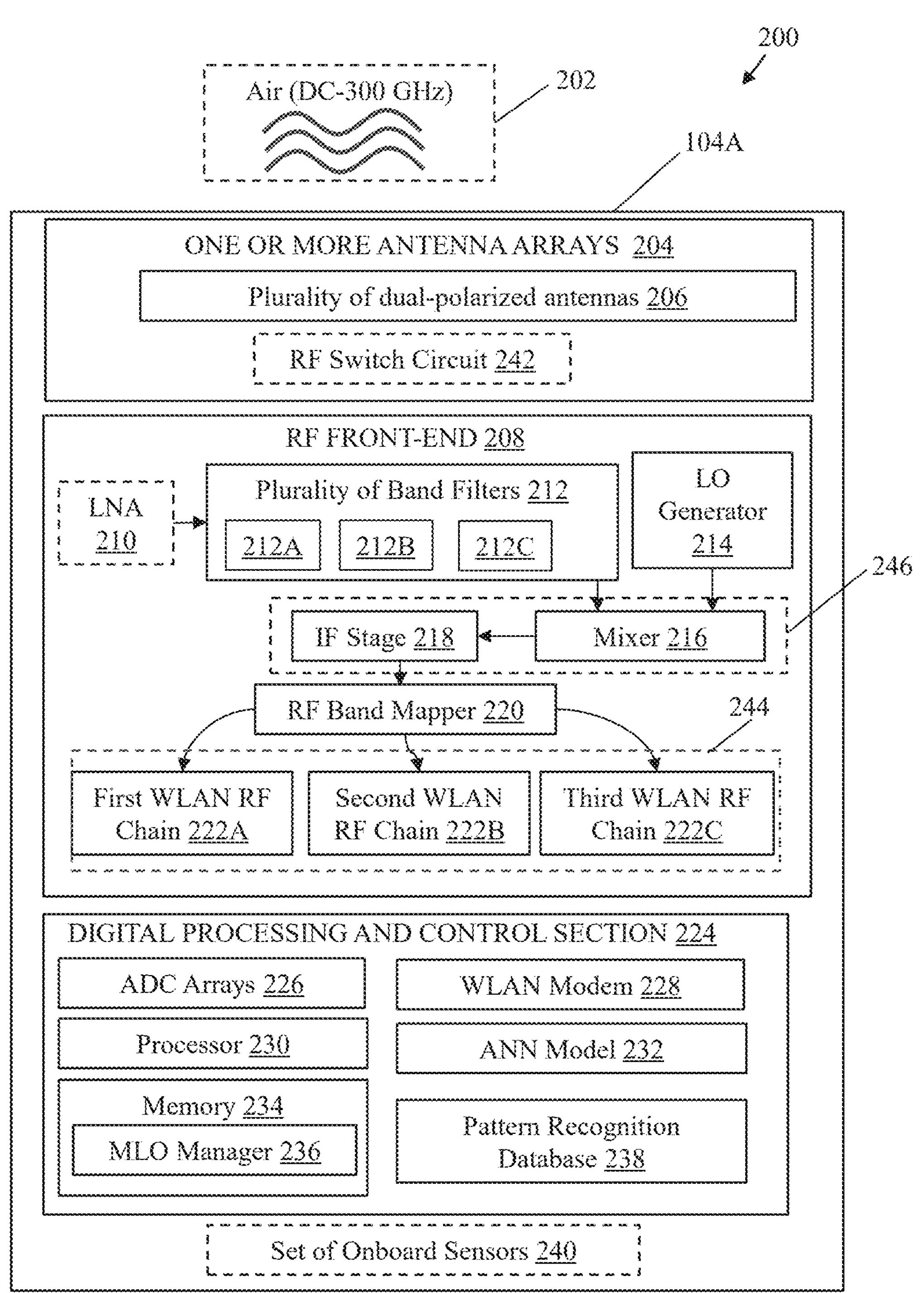
FIG. 2 is a block diagram that illustrates various components of an exemplary wireless communication device for enhanced resolution spectrum monitoring, in accordance with an exemplary embodiment of the disclosure.

FIG. 2 is a block diagram that illustrates various components of an exemplary wireless communication device for enhanced resolution spectrum monitoring, in accordance with an exemplary embodiment of the disclosure. FIG. 2 is explained in conjunction with elements from FIG. 1. With reference to FIG. 2, there is shown a block diagram 200 of the wireless communication device 104A.

The wireless communication device 104A may include an antenna array system, such as one or more antenna arrays 204. The antenna array system, such as the one or more antenna arrays 204, may include a plurality of dual-polarized antennas 206 and a radio frequency (RF) switch circuit 242. The wireless communication device 104A may further include an RF front-end 208 and a digital processing and control section 224.

The RF front-end 208 may include a Low-Noise Amplifier (LNA) 210, a plurality of band filters 212, a local oscillator generator 214, a mixer 216, an intermediate frequency (IF) stage 218, an RF band mapper 220, a WLAN radio (e.g., an IEEE 802.11be radio) comprising distinct RF chains for concurrent operations across different frequency bands, such as a first WLAN radio chain 222A (e.g., RF chain 1 for 2.4 GHz band processing), a second WLAN radio chain 222B (e.g., RF chain 2 for 5 GHz band processing), and a third WLAN radio chain 222C (e.g., RF chain 3 for 6 GHz band processing). Each chain may include dedicated components (e.g. LNA, mixers, filters) optimized for its specific frequency band, enabling simultaneous multi-band operation.

The digital processing and control section 224 may be configured to handle digital processing (e.g., analog to digital conversions, digital signal processing, multi-link operations (MLO) processing, baseband processing etc.), WLAN modem functions, as well as system control functions (e.g., a system on a chip (Soc)). The digital processing and control section 224 may include ADC arrays 226, a WLAN modem 228, a processor 230, an artificial neural network (ANN) model 232, a memory 234 with an MLO manager 236, and a pattern recognition database 238. In an implementation, the wireless communication device 104A may further include a set of onboard sensors 240.

The one or more antenna arrays 204 may be configured to receive RF signals across a plurality of frequency bands, for example, in a range of direct current (DC) to 300 gigahertz (GHz). The one or more antenna arrays 206 may include the plurality of dual-polarized antennas 206 configured to receive radio frequency signals in vertical and horizontal polarizations across the plurality of frequency bands, for example, ranging from direct current (DC) to 300 GHz. In an implementation, the one or more antenna arrays 204 may include one or more multiple-input and multiple-output (MIMO) antenna arrays and wideband antenna array. The one or more antenna arrays 204 may incorporate dedicated MIMO elements for 2.4, 5, and 6 GHz Wi-Fi® bands and wideband antenna elements for full spectrum coverage (e.g., DC-300 GHz) enabling comprehensive spectrum monitoring capabilities across multiple frequency bands (i.e., not only supports primary coverage from 1-7 GHz but manifest extended range capability to DC-300 GHz through multi-stage conversion techniques).

The RF front-end 208 may be configured to apply band-specific filtering to the received radio frequency signals to isolate signals-of-interest with at least 50-80 decibels of spurious signal suppression. In an implementation, the RF front-end 208 may maintain a noise figure below 3 decibels and phase noise performance of −110 dBc/Hz at 10 kHz offset with dynamic range exceeding 90 decibels. The RF front-end 208 may include a plurality of different low noise amplification stages, pre-filtering components, first stage mixing with local oscillator, and initial intermediate frequency stage processing.

The RF band mapper 220 may be configured to perform mapping of received radio frequency signals to defined intermediate frequencies (e.g., 2.4 GHz, 5 GHz, or 6 GHz). The RF band mapper 220 may enable concurrent processing of signals across multiple frequency bands. The RF band mapper 220 may perform demultiplexing of signals into WLAN bands (Wi-Fi® bands) and provide dedicated signal paths for 2.4/5/6 GHz processing with multi-stage frequency conversion.

The ADC arrays 226 may refer to analog-to-digital converter arrays configured to digitize the IF signals for processing. The WLAN modem 228 may include a wireless local area network modem configured to handle baseband signal processing, including digital processing operations such as Fast Fourier Transform (FFT)/Inverse Fast Fourier Transform (IFFT), signal equalization, Medium Access Control (MAC) layer processing, and Quality of Service (QoS) management.

The processor 230 may be configured to execute spectrum analysis, signal classification, and cross-band correlation across multiple intermediate frequency bands (e.g., 5 GHz and 6 GHz). The processor 230 may be part of the system on chip (Soc) and may incorporate one or more processing units including Central Processing Unit (CPU), Neural Processing Unit (NPU), and Digital Signal Processor (DSP) for specialized signal processing tasks.

The memory 234 may refer to a storage configured to store processing data and signal patterns. The memory 234 may provide hierarchical memory architecture for efficient data access and processing. Examples of implementation of the memory 234 may include, but not limited to, a random access memory (RAM), a dynamic random access memory (DRAM), a static random access memory (SRAM), a processor cache, a thyristor random access memory (T-RAM), a zero-capacitor random access memory (Z-RAM), a read only memory (ROM), a hard disk drive (HDD), a secure digital (SD) card, a flash drive, cache memory, and/or other non-volatile memory.

The MLO manager 236 may include a multi-link operation manager configured to control concurrent processing across multiple frequency bands and manage system interfaces for coordinated operation.

The pattern recognition database 238 may include a database system configured to maintain historical signal correlation patterns and update correlation thresholds based on pattern recognition results, enabling adaptive learning and pattern evolution tracking.

The set of onboard sensors 240 may include environmental and operational sensors configured to provide supplementary data to support signal classification and threat assessment capabilities, where the sensors enable enhanced contextual awareness for signal processing decisions. For example, the set of onboard sensors 240 may include one or more image sensors, a Light Detection and Ranging (LIDAR) sensor, a radar, a spatial position sensor, an inertial measurement unit (IMU) sensor, and a temperature sensor. A wide range of sensors may be integrated or connected to enrich each wireless communication device 104A with environmental awareness for intelligent intra-node and inter-node optimizations. For example, the one or more image sensors may be used to visually monitor the surroundings of each network node. The lidar sensor may be referred to as light detection and ranging sensors used to enable accurate three-dimensional (3D) profiling and depth perception of surroundings of each network node for precise beam alignment. The radar may be a built-in radar to detect and track motion to monitor movement patterns of surrounding objects and predict potential RF signal blockers. The spatial position sensor may be a global navigation satellite system (GNSS) sensor, such as global positioning system (GPS) to provide location awareness for each network node used for geospatial analytics and positioning capabilities. The IMU sensor may include a combination of accelerometers, gyroscopes, and magnetometers (sometimes magnetometers may not be used) that typically measures the body's specific force, angular rate, and orientation of a given body. In this case, such raw IMU output may be processed to measure node vibrations, shocks, and orientation changes at each network node.

The RF switch circuit 242 may include a radio frequency switch circuit configured to route signals between multiple antenna elements with switching time less than 100 microseconds and frequency step size of 100 kHz. The RF switch circuit 242 may enable rapid transitions between frequency bands for continuous spectrum monitoring. In an implementation, the RF switch circuit 242 may be configured to perform dynamic beam steering by switching between different phased antenna arrays installed at different positions around the wireless communication device 104A to route RF signals along different directions as required. This enables adaptable signal propagation, responding to changing network conditions and optimizing communication paths for improved reliability and performance.

The WLAN radio 244 may be a part of a WLAN chipset. The WLAN radio 244 may include distinct RF chains for concurrent operations across different frequency bands, such as the first WLAN radio chain 222A (e.g., RF chain 1 for 2.4 GHz band processing), the second WLAN radio chain 222B (e.g., RF chain 2 for 5 GHz band processing), and the third WLAN radio chain 222C (e.g., RF chain 3 for 6 GHz band processing). Each RF chain may include dedicated components (LNA, mixers, filters) optimized for a specific frequency band, enabling simultaneous multi-band operation. The circuitry 246 may include the mixer 216, the IF stage 218, and/or other control circuits.

In operation, the one or more antenna arrays 204 may be configured to receive RF signals across a plurality of frequency bands. In an example, the plurality of frequency bands may be a range of direct current (DC, i.e., 0 Hz) to 300 gigahertz (GHz). The one or more antenna arrays 204 may include the plurality of dual-polarized antennas 206 configured to capture the RF signals in vertical and horizontal polarizations across the plurality of frequency bands. In FIG. 2, the RF signals in the air captured by the one or more antenna arrays 204 may be represented by wavy lines (i.e., the airwave 202). In an example, the one or more antenna arrays 204 may be a 4×4 MIMO array. In an implementation, the one or more antenna arrays 204 may be an antenna array system that may include one or more wide array antennas and may provide 360° coverage pattern. In an implementation, the one or more antenna arrays 206 may include four independent antenna elements with different phases (0°, 90°, 180°, 270°). The one or more antenna arrays 206 may be configured to receive multiple independent data streams concurrently on different antennas, effectively increasing capacity without requiring more bandwidth. The receipt of the same signal from different antennas may provide diversity gain to combat fading and improve signal reliability. Further, the plurality of dual-polarized antennas 206 are configured to enhance signal reception and improve spectral efficiency by capturing RF signals in both vertical and horizontal polarizations across multiple frequency bands. For example, each antenna element within the one or more antenna arrays 204 may be equipped with orthogonally oriented dipoles or patch radiators that are capable of concurrently receiving RF signals in both vertical and horizontal polarization planes. Each antenna element of the plurality of dual-polarized antennas 206 supports two independent polarization modes (vertical and horizontal), where the combination of MIMO with dual polarization effectively doubles the data communication capacity without increasing bandwidth or frequency usage. Further, as the plurality of dual-polarized antennas 206 allow two independent communication channels per antenna, the need for additional physical antennas is reduced, which may be useful for space-limited applications for compact antenna design and contribute to portability of the wireless communication device 104A. The combination of MIMO feature with the dual-polarized antennas allows the wireless communication device 104A to capture signals from multiple spatial points and enhances detection accuracy with full polarization coverage for all types of transmissions. The combination of MIMO feature with the dual-polarized antennas enables to detect hidden, weak, or non-line-of-sight (NLOS) signals, useful in crowded RF environments.

In accordance with an embodiment, the plurality of frequency bands captured by the one or more antenna arrays 204 may range from DC to 100 gigahertz (GHz). In other words, the wireless communication device 104A may perform a real-time, wide-band spectrum monitoring across frequencies ranging from DC to 100 GHz with high resolution (for example, down to 19.53125 kHz). In accordance with an embodiment, the plurality of frequency bands captured by the one or more antenna arrays 206 may range from direct current (DC) to 300 gigahertz (GHz). The wireless communication device 104A may be a multi-function device for spectrum-sensing across the plurality of frequency bands with high resolution as well as for wireless data communication with one or more wireless communication devices 104B, 104C, . . . , 104N in the wireless mesh network 106. In other words, each network node functions as both a spectrum analyzer and a high-speed communication endpoint.

In accordance with an embodiment, the RF front-end 208 may be coupled to the one or more antenna arrays 204. The RF front-end 208 may include the plurality of band filters 212. The plurality of band filters 212 may be configured to apply band-specific filtering operation to the received RF signals to obtain filtered RF signals. In an implementation, the LNA 210 may be placed before pre-filtering stage, as spectrum monitoring may often involve detecting weak or distant signals (e.g., covert transmissions, military radar, low-power IoT devices). Further, to sniff RF signals from the airwave 202, especially the broad frequency range (e.g., DC-300 GHz), the LNA 210 first approach ensures that signals across all frequencies are captured with minimal loss before band-specific filtering. The LNA 210 may amplify such weak signals before they encounter any filtering losses, improving detection accuracy. In some implementations, the LNA 210 may not be placed before the plurality of band filters 212 to reduce out-of-band interference. The wireless communication device 104A may opt for both options of LNA 210 first or without LNA 210 alternatively to evaluate if there is any difference in spectrum monitoring results for enhanced analysis.

In an example, the plurality of band filters 212 may be pre-filters that may process signals across distinct frequency ranges. The plurality of band filters 212 may include a first band filter 212A (e.g., a low-band filter) configured to process the received RF signals in a first frequency range. The plurality of band filters 212 may further include a second band filter 212B (e.g., a mid-band filter) configured to process the received RF signals in a second frequency range, where the second frequency range may be higher than the first frequency range. The plurality of band filters 212 may further include a third band filter 212C (e.g., a high-band filter) configured to process the received RF signals in a third frequency range, where the third frequency range may be higher than the second frequency range. In an implementation, the first frequency range may be 1 hertz (Hz) to 1 GHz, the second frequency range may be 1.1 to 3 GHz, and the third frequency range may be between 3.1 GHz to 300 GHz. In another implementation, the first frequency range may be 50 MHz to 2 GHz, the second frequency range may be 2.4 to 6 or 7 GHz, and the third frequency range may be between 7.1 GHz to 300 GHz. The first frequency range that may be used for low band filtering operation may eliminate interference from TV, FM, and LTE signals. The second frequency range that may be used for mid band filtering operation may be used to suppress cellular and adjacent Wi-Fi® bands, and the third frequency range may be used for high band filtering operation may isolate high-frequency signals from 5G, radar, and millimeter-wave sources. In an implementation, the RF front-end 208 may employ a multi-stage filtering architecture that may include cavity filters providing high-Q resonance, Surface Acoustic Wave (SAW) filters, and Bulk Acoustic Wave (BAW) filters for precise frequency selectivity. In some implementation, the wireless communication device 104A may implement an adaptive digital filtering operation using DSP-based notch filters after the analog filtering stage, which may enhance the overall spurious signal rejection capabilities. Further, the implementation of narrowband bandpass filters may enable selective passing of signals-of-interest while maintaining substantial attenuation of unwanted RF signals, wherein the multi-stage spurious suppression techniques may achieve 50-80 dB of rejection. This comprehensive filtering approach may be advantageous in dense RF environments where multiple interfering signals may be present, enabling the system to effectively isolate and monitor specific frequency bands of interest while maintaining high signal quality through robust interference suppression.

In accordance with an embodiment, the band-specific filtering operation may include determining an input RF signal frequency and directing the input RF signal through one of three concurrent filtering paths based on frequency range. For example, a first path employing a low-band filter for frequencies of 1 Hz to 2 GHz (or 50 MHz to 1 GHz as per use case) with subsequent up-conversion, a second path employing a mid-band filter for frequencies of 2.4 GHz to 7 GHz (or 1.1 to 3 GHz) with direct conversion, and a third path employing a high-band filter for frequencies of 7.1 GHz to 300 GHz (or 3.1 to 300 GHz) with down-conversion. The filtered signals from all paths may converge at the circuitry 246 (e.g., a mixer stage, such as the mixer 216) that may utilize a high-side local oscillator (e.g., the local oscillator generator 214) that may operate above a threshold frequency of 9.8 GHz for final frequency conversion, thereby achieving efficient spectrum coverage while maintaining signal integrity. The second band filter (i.e., the mid-band filter) for frequencies of 2.4 GHz to 7 GHz (or 1.1 to 3 GHz) may be configured to perform direct conversion as frequencies are already close to the predetermined intermediate frequencies (e.g., the Wi-Fi® frequencies).

In accordance with an embodiment, the local oscillator generator 214 may be configured to generate tunable local oscillator frequencies above a threshold frequency. In an example, the threshold frequency may be 9.8 GHz. The circuitry 246 may be coupled to the plurality of band filters 212 and the local oscillator generator 214. The circuitry 246 may be further configured to determine an input RF signal frequency of the received RF signals from among the plurality of frequency bands of Dc to 300 GHz. The circuitry 246 may be further configured to generate, via the local oscillator generator 214, a specific local oscillator frequency that is higher than the determined RF signal frequency by a defined offset. The circuitry 246 may be further configured to perform a high-side injection based on the specific local oscillator frequency to push the image frequencies above the threshold frequency (while maintaining phase noise performance of better than-90 dBc/Hz (i.e., decibels relative to carrier) at 100 kHz offset). For example, when processing a 6 GHz signal, the local oscillator generator 214 may generate a frequency of 11 GHz to create a desired intermediate frequency at 5 GHz (e.g., 11 GHz-6 GHz=5 GHz) and an image frequency at 17 GHz (i.e., 11 GHz+6 GHz=17 GHz) that may be naturally attenuated, thereby enabling efficient frequency conversion while ensuring image frequencies are pushed into naturally attenuating regions of the spectrum. The local oscillator frequencies may be adjusted in real-time based on the detected input signal frequency, desired intermediate frequency for processing, required image frequency suppression, and phase noise optimization requirements. Further, the phase noise performance of better than-90 dBc/Hz (i.e., decibels relative to carrier) at 100 kHz offset may be indicative of reduced phase noise (more negative dBc/Hz). The reduced phase noise indicates better frequency stability and better stability as it enables more accurate frequency conversion and improved signal quality in the converted intermediate frequencies.

In accordance with an embodiment, the circuitry 246 may be configured to execute a frequency shifting operation in one or more frequency conversion stages in which one or more tuned local oscillator frequencies above the threshold frequency may be injected at the circuitry 246 to push image frequencies above the threshold frequency and shift the filtered RF signals to defined intermediate frequencies. The frequency shifting operation may include either one or multiple frequency conversion stages, where each conversion stage may be configured to translate a received RF signal to a predetermined intermediate frequency through strategic local oscillator injection. When mixing occurs at the circuitry 246 (i.e., mixing of the tuned local oscillator frequency with the filtered RF signal at an RF frequency at the mixer stage, i.e., at the mixer 216), a sum difference and a difference frequency may be obtained. The difference frequency (RF-LO frequency) may be selected as the desired intermediate frequency (IF), such as 5 GHz, 6 GHz, or 7 GHz while the sum frequency becomes the image frequency and may be discarded. In this case, the system 100 uses high-side local oscillator injection(s), in which the image frequencies may be pushed above 9.8 GHz (e.g., the threshold frequency). At these high frequencies i.e., the image frequencies, the signals naturally attenuate more due to atmospheric absorption, path loss, material absorption, or component limitations. In this case, the IF selection may be predetermined ensuring compatibility with subsequent digitization hardware (e.g., the IEEE 802.11be chipset, such as the WLAN radio 244 and the WLAN modem 228). The down-conversion to defined intermediate frequencies allows the wireless communication device 104A to leverage, for example, the IEEE 802.11be chipset's processing architectures, reducing hardware complexity, while re-purposing for enhanced spectrum monitoring as well as wireless data communication. Thus, the intelligent use of frequency shifting architecture provides simpler filtering requirements since images are naturally attenuated and enable cleaner signal conversion with less interference. The intelligent use of frequency shifting architecture reduces complexity and cost of the RF front-end 208 and improves overall system performance. In an example, the high-side local oscillator frequencies means that the local oscillator frequency may be higher than the target RF signal. The local oscillator generator 214 may be a tunable local oscillator that may generate different tuned local oscillator frequencies depending on detected input signal frequency in the filtered RF-signal and the desired intermediate frequency (e.g., 5 GHz or 6 GHz) to be generated and further processed.

It is to be understood that WLAN chipsets like Wi-Fi® 7 chips may only process certain frequencies (like 2.4 GHz, 5

GHz, 6 GHz). However, if many frequencies (up to 300 GHz) are to be monitored, then such frequencies may be converted intelligently so the WLAN chipsets (e.g., the WLAN radio 244 and the WLAN modem 228) may process the converted frequencies. In an example, the circuitry 246 may be configured to execute a multi-stage frequency shifting operation, where for signals in different frequency ranges, the following conversions may be implemented. For example, for signals at 100 GHz, a first stage conversion may inject an 85 GHz local oscillator frequency to achieve a difference frequency of 15 GHz (100 GHz-85 GHz=15 GHz) while producing an image frequency at 185 GHz (100 GHz+85 GHz=185 GHz), followed by a second stage employing a 9 GHz local oscillator frequency to convert the 15 GHz signal to a final intermediate frequency of 6 GHz (15 GHz-9 GHz=6 GHz), with the second image at 24 GHz image frequency (15 GHz+9 GHz=24 GHz) experiencing natural attenuation. The final intermediate frequency of 6 GHz may be one of the defined intermediate frequencies (or simply referred to as the intermediate frequencies). In an implementation, other defined intermediate frequencies may be 2.4 GHz and 5 GHz. In some implementations, other unlicensed or Industrial, scientific, and medical (ISM) frequency bands may be used.

In accordance with an embodiment, the circuitry 246 may be further configured to convert the filtered RF signals to one or more intermediate frequencies (IFs) (e.g., 2.4 GHz, 5 GHz, or 6 GHz). In other words, the circuitry 246 may convert any sample RF input signal (DC to 300 GHz) to one or more Wi-Fi® 7-compatible intermediate frequencies for digital processing based on the band filtering operation and the high-side LO injection. For example, consider three RF signals received concurrently: a 500 MHz cellular signal, a 6 GHz Wi-Fi® signal, and a 28 GHz 5G millimeter-wave signal. The band filtering operation may direct each signal through dedicated paths, wherein the 500 MHz signal follows the low-band path that may require up-conversion to achieve 2.4 GHz intermediate frequency. The 6 GHz signal may follow the mid-band path with direct conversion maintaining 6 GHz intermediate frequency since the 6 GHz already falls within Wi-Fi® 7 processing range. The 28 GHz signal may follow the high-band path, where high-side LO injection at 23 GHz may create a difference frequency of 5 GHz intermediate frequency (28 GHz-23 GHz=5 GHz) while pushing the image frequency to 51 GHz where natural attenuation occurs. All three signals, despite originating across vastly different frequency ranges spanning DC to 300 GHz, may be converted to Wi-Fi® 7-compatible intermediate frequencies of 2.4 GHz, 5 GHz, and 6 GHz respectively, enabling the same commercial Wi-Fi® 7 chipset hardware to process and analyze signals that would traditionally require multiple specialized and expensive spectrum analyzer systems, thereby achieving universal spectrum monitoring capability through intelligent frequency translation and hardware reuse.

In accordance with an embodiment, alternatively, the circuitry 246 may be configured to convert multiple RF input signals of different frequencies to the same intermediate frequency, enabling consolidated processing through a single WLAN (Wi-Fi® 7) compatible frequency band. For example, a 10 GHz radar signal, a 28 GHz 5G millimeter-wave signal, and a 50 GHz satellite communication signal may all be down-converted to the same 5 GHz intermediate frequency through strategic local oscillator selection. For example, the 10 GHz signal may use a 15 GHz LO frequency (15 GHz-10 GHz=5 GHz IF), the 28 GHz signal may use a 23 GHz LO frequency (28 GHz-23 GHz=5 GHz IF), and the 50 GHz signal may use a 45 GHz LO frequency (50 GHz-45 GHz=5 GHz IF). The consolidation of multiple input signals to one intermediate frequency may further maximize hardware efficiency by utilizing a single ADC and digital processing chain to handle multiple enhanced resolution measurements. For example, the target intermediate frequency may be 5 or 6 GHz (chosen based on Wi-Fi® 7 chipset capability or current processing load in one WLAN chain).

In accordance with an embodiment, the local oscillator generator 214 may be further configured to generate a sequence of offset frequencies. Each offset frequency in the sequence of offset frequencies may differ from adjacent offset frequencies by a defined frequency drift value. In other words, the local oscillator generator 214 may be further configured to generate slightly offset LO frequencies that may differ from each other by a certain value, i.e., the defined frequency drift value. The local oscillator generator 214 may be configured to sequentially produce multiple local oscillator frequencies with determined incremental offsets. The local oscillator generator 214 may generate a base local oscillator frequency corresponding to the desired intermediate frequency conversion, and then systematically increment the base frequency by the defined frequency drift value for each subsequent measurement cycle. The defined frequency drift value may be configured between 10 Hz to 500 (or 1000 Hz) depending on the desired resolution enhancement factor and signal characteristics being analyzed. In an example, the local oscillator generator 214 may implement fractional-N phase-locked loop synthesis or direct digital synthesis to achieve precise frequency step control with sub-hertz accuracy. The sequence generation process may enable the circuitry 246 to perform multiple spectrum measurements of the same input RF signal using slightly different local oscillator frequencies, where each measurement captures phase coherence information that varies based on the frequency offset between the signal and the local oscillator frequency. The systematic frequency stepping may create controlled phase relationships between measurements that enable the processor 230 at a later stage to extract sub-FFT-bin resolution information through coherent combining, thereby achieving enhanced frequency resolution that exceeds the base FFT capability of the Wi-Fi® 7 chipset without requiring larger FFT sizes or custom hardware modifications.

In accordance with an embodiment, the local oscillator generator 214 may be configured to generate the sequence of offset frequencies specifically designed for processing RF signals that are converted to intermediate frequencies including 2.4 GHz, 5 GHz, or 6 GHz. The local oscillator generator 214 may systematically create offset frequencies by incrementing the base frequency in predetermined steps (e.g., 10 Hz, 50 Hz, or 100 Hz). The sequence generation process may implement frequency offsets ranging from 50 Hz to 500 Hz increments above the specific intermediate frequency, enabling multiple spectrum measurements of the same 2.4 GHz, 5 GHz, or 6 GHz intermediate frequency signal with different phase characteristics.

In accordance with an embodiment, alternatively, the mixer 216 may be configured to mix the filtered RF signals with each offset frequency from the sequence of offset frequencies to convert the filtered RF signals directly to the intermediate frequencies. The mixer may be configured to implement high-side local oscillator injection by utilizing offset frequencies that are higher than the filtered RF signal frequencies, where each offset frequency in the sequence may retain the high-side injection relationship while providing systematic frequency variations for enhanced resolution processing. For example, the mixer 216 may receive a 28 GHz filtered RF signal and mix it with a sequence of high side offset frequencies including 33.000 GHz, 33.001 GHz, and 33.002 GHz to generate intermediate frequencies of 5.000 GHz, 5.001 GHz, and 5.002 GHz respectively. Each mixing operation may produce a difference frequency in the desired intermediate frequency range while pushing image frequencies above the threshold frequency where natural attenuation occurs. The mixer 216 may implement the LO drifting operation within the existing high-side injection architecture by systematically varying the local oscillator frequency in small increments while maintaining the fundamental frequency conversion principle. The same high-side injection benefits of image frequency suppression may be preserved while enabling multiple measurements of the same RF input signal with different phase characteristics. The mixer 216 operation may combine the advantages of high-side injection frequency conversion with the enhanced resolution capability of LO drifting by using offset frequencies that concurrently achieve proper intermediate frequency generation and provide the phase coherence information necessary for sub-FFT-bin resolution analysis. The mixer 216 may process each offset frequency sequentially or through parallel processing paths. The high-side injection operation may ensure clean frequency conversion while the offset frequency sequence enable coherent combining operation at a later stage to extract enhanced frequency resolution from the systematic phase variations between measurements.

In accordance with an embodiment, the circuitry 246 may be further configured to digitize the filtered RF signals at the one or more IFs (e.g., currently in an analog form) to obtain digitized IF signals. The circuitry 246 may process the filtered RF signals at the one or more IFs through an Analog-to-Digital Converter (ADC) that may sample and convert the analog IF signals into digital form. Further, the selection of intermediate frequencies may be specifically configured to avoid interference from other signals while matching ADC bandwidth and resolution requirements. The frequency conversion and digitization approach to intermediate frequencies may enable advanced digital signal processing capabilities, including real-time filtering, demodulation, and pattern recognition, which may be beneficial for spectrum monitoring applications requiring signal classification, anomaly detection, and cognitive RF adaptation for interference mitigation. In an example, the conversion process may include sampling the intermediate frequency signals (5 GHz and 6 GHz) using analog-to-digital converters (ADCs) operating at greater than twice the highest intermediate frequency, such that for the 6 GHz intermediate frequency, ADCs with sampling rate of at least 12 GigaSamples per second (GSps) may be employed while maintaining effective number of bits (ENOB) of 10 or higher and achieving signal-to-noise ratio (SNR) better than 60 dB, and for the 5 GHz intermediate frequency, ADCs with sampling rate of at least 10 GSps may be utilized while maintaining ENOB of 10 or higher and achieving SNR better than 60 dB. The WLAN chipset for example, the WLAN radio 244, may process the digitized IF signals, for real-time spectrum analysis, thereby enabling efficient digital signal processing of the converted RF signals while maintaining signal integrity and dynamic range requirements for accurate spectrum monitoring.

In accordance with an embodiment, the RF front-end 208 may be further configured to demultiplex the filtered RF signals at the intermediate frequencies into one or more different wireless local area network (WLAN) frequency channels. The RF front-end 208 may be further configured to assign a distinct signal processing path to each WLAN frequency channel of the one or more different WLAN frequency channels. The RF front-end 208 may be further configured to perform an RF mapping of the received RF signals in the plurality of frequency bands to one of the intermediate frequencies corresponding to a first intermediate frequency band or a second intermediate frequency band. The first intermediate frequency band may be different from the second intermediate frequency band. Each of the intermediate frequencies that may correspond to the first intermediate frequency band and the second intermediate frequency band is one of: 2.4 GHz, 5 GHz, 6 GHz, 7 GHz, or other unlicensed or Industrial, scientific, and medical (ISM) frequency band. The RF band mapper 220 may be configured to demultiplex the filtered RF signals at the intermediate frequencies (e.g., a common intermediate frequency or one or more intermediate frequencies) into different WLAN frequency bands (e.g., 2.4 GHz, 5 GHz, and 6 GHz) and may assign dedicated paths for efficient processing. The frequency mapping may ensure that the signals are optimally allocated and processed based on resource availability. Based on the resource status, the RF band mapper 220 may be configured to perform the best IF band assignment out of the different WLAN frequency bands. Once the RF mapping is complete, the digitized IF signals may then be processed.

In an example, the RF mapping may incorporate channel and spatial mapping capabilities, wherein each frequency band may be divided into distinct channels, and spatial mapping may be performed to optimize beamforming and interference management. The wireless communication device 104A may implement a resource allocation mechanism that may dynamically check available resources and perform load balancing across the 2.4/5/6 GHz bands based on congestion levels. Further, the RF front-end 208 may assign dedicated processing paths to the different WLAN frequency bands, where the signals may undergo specific filtering, mixing, and digitization processes based on defined IF mapping configurations. In other words, the RF front-end 208 may assign dedicated processing paths to the WLAN radio 244 (e.g., an IEEE 802.11be radio) including distinct RF chains for concurrent operations across different frequency bands, such as the first WLAN radio chain 222A (e.g., RF chain 1 for 2.4 GHz band processing), the second WLAN radio chain 222B (e.g., RF chain 2 for 5 GHz band processing), and the third WLAN radio chain 222C (e.g., RF chain 3 for 6 GHz band processing). Each chain may include dedicated components (e.g. LNA, mixers, filters) optimized for its specific frequency band, enabling simultaneous multi-band operation. This comprehensive RF mapping approach may enable efficient spectrum utilization and optimal signal processing, particularly beneficial for next operation of implementing Multi-Link Operation (MLO) that may require dynamic frequency assignment across multiple bands while maintaining minimal interference and maximum processing efficiency.

In accordance with an embodiment, optionally, each offset frequency may create a separate measurement cycle. For example, Measurement 1: LO offset 1 followed by frequency conversion to intermediate frequencies, digitization and storage of phase information; Measurement 2: LO offset 2 followed by frequency conversion, digitization and storage of phase information; Measurement 3: LO offset 2 followed by frequency conversion, digitization and storage of phase information. Each measurement may be separately digitized and the processor 230 may later combine the multiple digitized measurements using phase coherence information. The offset frequencies may create multiple sequential measurements where each offset LO frequency produces its own digitized spectrum measurement that may be stored and later combined.

In accordance with an embodiment, the processor 230 may be configured to execute a plurality of spectrum measurements for the digitized IF signals. Each spectrum measurement of the plurality of spectrum measurements may be based on a different offset frequency of the sequence of offset frequencies. Each spectrum measurement may be associated with a first frequency resolution. The processor 230 may be configured to perform a plurality of Fast Fourier Transform (FFT) operations on the digitized IF signals. Each FFT operation of the plurality of FFT operations may correspond to a different local oscillator offset frequency from the sequence generated by the local oscillator generator 214. The processor 230 may execute spectrum analysis using the WLAN chipset (e.g., WLAN radio and 244 and the WLAN modem 228 like Wi-Fi® 7 chipset) base FFT processing capability. The processor 230 may execute spectrum analysis, for example, by implementation of 1024-point or 2048-point FFT operations that may achieve the first frequency resolution determined by the relationship of sample rate divided by FFT size. The processor 230 may process the digitized IF signals that resulted from mixing with a different offset frequency. For example, a first spectrum measurement may use the digitized IF signal mixed with the base local oscillator frequency, the second spectrum measurement may use digitized IF signal mixed with the base frequency plus the defined frequency drift value, and subsequent measurements may use progressively offset frequencies. Each spectrum measurement may utilize the same FFT size and processing parameters to ensure consistent first frequency resolution across all measurements while capturing different phase characteristics and amplitude characteristics of the input signal (e.g., input digitized IF signals). The processor 230 may store each spectrum measurement result in memory buffers with associated metadata. The metadata may identify the corresponding offset frequency used during signal acquisition. The systematic execution of multiple spectrum measurements enables the processor 230 to capture phase coherence variations that occur due to the slight frequency differences between the signal, and each offset local oscillator frequency, thereby providing the raw data necessary for subsequent combining operation (may also be referred to as coherent combining) to extract enhanced resolution information beyond the limitations of the first frequency resolution.

In accordance with an embodiment, the processor 230 may be further configured to store phase coherence information for each spectrum measurement of the plurality of spectrum measurements. The processor 230 may be configured to capture phase and amplitude data generated during each FFT operation performed on the digitized IF signals. The processor 230 may extract phase coherence information by recording complex FFT coefficients that include both magnitude and phase components for each frequency bin. The phase coherence information may represent the temporal relationship between the input signal and the corresponding local oscillator offset frequency used during each measurement cycle. The processor 230 may store the phase coherence information in dedicated memory buffers with precise timestamp correlation to the specific offset frequency used during signal acquisition. The phase coherence information may include complex exponential representations of signal components that preserve critical phase relationships necessary for coherent combining algorithms to extract sub-FFT-bin resolution data. Alternatively, the phase coherence information may include data that characterizes signal relationships between the plurality of spectrum measurements. The phase coherence information may represent timing and amplitude characteristics of spectral components captured during each spectrum measurement using different offset frequencies of the sequence of offset frequencies. The phase coherence information may preserve correlation data that links signal characteristics to the corresponding offset frequency used during measurement acquisition. The phase coherence information preserves signal relationship data necessary for subsequent processing to determine enhanced frequency resolution from the plurality of spectrum measurements. The phase coherence information includes signal characteristic data that enables analysis of how spectral components vary across different offset frequency measurements, where the variation provides information for achieving frequency resolution beyond individual spectrum measurement capabilities. The processor 230 may store the phase coherence information with sufficient numerical precision to preserve sub-degree phase accuracy, for example, storing 16-bit or 32-bit floating-point representations of both real and imaginary components of complex FFT outputs. The systematic storage of phase coherence information may enable the processor 230 to perform cross-correlation analysis between different offset frequency measurements, where phase rotation patterns may provide the foundation for achieving enhanced frequency resolution through coherent signal processing techniques that exceed base FFT capability limitations.

In accordance with an embodiment, the phase rotation patterns may enable precise frequency determination of signals through analysis of predictable phase evolution across multiple offset frequency measurements. When the local oscillator generator 214 produces offset frequencies, each spectrum measurement may capture the same input signal with a slightly different phase relationship. The signals that exhibit linear phase rotation rates may be directly proportional to their frequency offset from the local oscillator frequency. The coherent combining may analyze how signal phases evolve across the sequence of measurements. For example, a signal at precisely 5.0001 GHz may show predictable phase progression of 0 degrees, 36 degrees, and 72 degrees across three sequential LO offset measurements, enabling back-calculation of the exact signal frequency through the relationship that phase rotation rate equals 2× times the frequency difference times the measurement interval. The systematic phase rotation patterns may reveal precise signal locations within or between FFT frequency bins with resolution significantly finer than the base FFT bin spacing, where signals that appear smeared across multiple bins in individual measurements may be precisely localized through correlation analysis of their phase evolution behavior. The phase rotation analysis may enable the processor 230 to achieve sub-FFT-bin frequency resolution by extracting frequency information from phase relationships rather than requiring larger FFT sizes or specialized hardware modifications.

In accordance with an embodiment, the processor 230 may be further configured to combine the plurality of spectrum measurements based on the stored phase coherence information to generate a spectrum analysis output with a second frequency resolution that exceeds the first frequency resolution. The processor 230 may be configured to execute a combining operation that processes the stored phase coherence information from each spectrum measurement to reconstruct signal characteristics with enhanced frequency precision. The processor 230 may analyze how signal components appear differently across the plurality of spectrum measurements due to the different offset frequencies used during signal acquisition. Each spectrum measurement may capture the same input signals (e.g., 6 GHz or 5 GHz intermediate frequency) with slightly different timing relationships. The combining operation may identify signal patterns that remain consistent across measurements while tracking how signal characteristics shift predictably between measurements, enabling the processor 230 to determine precise signal locations that individual spectrum measurements cannot resolve. The processor 230 may process the phase coherence information to distinguish between signal components that appear blurred together in individual measurements, where signals separated by frequency differences smaller than the first frequency resolution may be separated and characterized as distinct spectral components. The combining process may generate the spectrum analysis output by reconstructing frequency domain data that reveals signal details previously hidden within individual FFT frequency bins. The second frequency resolution may achieve signal discrimination capabilities significantly finer than the base Wi-Fi® 7 chipset FFT processing limitations. The processor 230 may implement the combining operation by aligning and merging the spectrum measurements based on their phase relationships and applying signal processing that extract enhanced frequency information from the systematic variations captured across the offset frequency sequence. The combining operation may achieve frequency resolution enhancement without requiring larger FFT processing or specialized hardware beyond the existing Wi-Fi® 7 chipset capabilities.

In an example, when the processor 230 may analyze a signal component at 6.0001 GHz within the 6 GHz intermediate frequency band, the local oscillator generator 214 may generate a sequence of offset frequencies with 100 Hz increments: $LO_1$=6.0000 GHz, $LO_2$=6.0001 GHz, $LO_3$=6.0002 GHz, and $LO_4$=6.0003 GHz, where each offset frequency produces a separate spectrum measurement with identical 312.5 kHz base resolution but different phase relationships to the same signal component. The processor 230 may store phase coherence information that indicates that the 6.0001 GHz signal component exhibits phase values of 0 degrees with $LO_1$, 90 degrees with $LO_2$, 180 degrees with $LO_3$, and 270 degrees with $LO_4$, creating a systematic phase rotation pattern of 90 degrees per 100 Hz LO increment that reveals the precise frequency offset of a signal from each local oscillator frequency. The coherent combining operation may process the stored phase coherence information by analyzing the linear phase progression across the four measurements to determine that the signal component is located exactly 100 kHz above the 6.000 GHz reference frequency, even though this frequency difference is significantly smaller than the 312.5 kHz resolution limit of individual FFT measurements. The processor 230 may combine the sequence of measurements by correlating the phase rotation patterns and reconstructing the signal's precise spectral characteristics. The systematic 90-degree phase steps across 100 Hz LO increments may provide sufficient information to resolve signal components separated by 25 kHz or less. The combining process may generate a spectrum analysis output with the second frequency resolution of 25 kHz compared to the first frequency resolution of 312.5 kHz, thereby achieving a resolution enhancement factor of approximately 12× through phase coherence analysis of the offset frequency sequence without requiring larger FFT processing or custom hardware modifications beyond the existing Wi-Fi® 7 chipset capabilities.

In an example, the processor 230 may be configured to combine the plurality of spectrum measurements by processing phase coherence information that captures how the same signal appears with different phase relationships across the sequence of offset frequency measurements. For example, when analyzing a narrowband signal at 6.0001 GHz within the 6 GHz intermediate frequency band, the processor 230 may store phase coherence information showing that measurement 1 (using 6.0000 GHz LO) captures the signal with 0 degrees phase, measurement 2 (using 6.0001 GHz LO) captures the same signal with 180 degrees phase, measurement 3 (using 6.0002 GHz LO) captures the signal with 0 degrees phase again, and measurement 4 (using 6.0003 GHz LO) captures the signal with 180 degrees phase, creating a predictable phase alternation pattern that indicates the signal frequency may be halfway between the first two LO frequencies. The processor 230 may combine these measurements by recognizing that when measurements 1 and 3 show positive amplitude values and measurements 2 and 4 show negative amplitude values for the same frequency bin, the signal may be located precisely at the midpoint frequency of 6.00005 GHz, which may be 50 kHz above the reference and much smaller than the 312.5 kHz base resolution. The combining operation may utilize the stored timing relationships between measurements to align signal components before mathematical processing. The processor 230 may identify that the alternating positive and negative amplitude patterns across the offset sequence indicates a signal frequency that lies exactly between measurement reference points rather than at a measurement reference point. The processor 230 may combine the measurements by reconstructing the signal characteristics using the phase relationship data, where signals showing consistent phase patterns across measurements may be enhanced while noise components showing random phase variations may be suppressed. The combining process may generate a spectrum analysis output that precisely locates the 6.00005 GHz signal component with 50 kHz resolution accuracy, demonstrating frequency discrimination approximately 6 to 12 times finer than the 312.5 kHz first frequency resolution achieved through coherent processing of the stored phase coherence information from the sequence of offset frequency measurements.

In accordance with an embodiment, the processor 230 may be configured to implement combining algorithms that process the stored phase coherence information to achieve enhanced frequency resolution. The combining algorithms may include but not be limited to phase-based interpolation algorithms that analyze phase progression patterns across offset measurements to determine precise signal locations between FFT bins, coherent averaging algorithms that align measurement phases before combining to enhance signal components while suppressing noise, phase difference analysis algorithms that calculate frequency offsets based on phase variations between sequential measurements, phase vector summation algorithms that combine complex vectors based on phase alignment, phase correlation algorithms that analyze cross-correlation of phase information between offset measurements, and phase tracking algorithms that follow signal phase evolution across the offset sequence to reconstruct precise spectral characteristics. The selection of specific combining algorithms may be determined based on signal characteristics and phase coherence patterns, enabling the processor 230 to achieve sub-FFT-bin frequency resolution through processing of the systematic phase variations captured across the sequence of offset frequency measurements.

In accordance with an embodiment, the processor 230 may be further configured to apply a phase correction to each spectrum measurement of the plurality of spectrum measurements to obtain a plurality of phase-corrected spectrum measurements. The processor 230 may be configured to apply phase correction by adjusting the phase values in each spectrum measurement of the plurality of spectrum measurements. The processor 230 may calculate how much phase shift occurred due to each different offset frequency of the sequence of offset frequencies used during measurement. The processor 230 may determine the correction amount needed to align all spectrum measurements to the same phase reference point. For example, if measurement 1 shows a signal with 0 degrees phase, measurement 2 shows the same signal with 45 degrees phase, and measurement 3 shows the signal with 90 degrees phase, the processor 230 may calculate correction amounts of 0 degrees for measurement 1, −45 degrees for measurement 2, and −90 degrees for measurement 3 to bring all measurements to the same 0-degree reference. The processor 230 may apply these corrections by subtracting the calculated amounts from each measurement's phase values. The processor 230 may apply the phase correction by rotating the phase values in each measurement by the calculated correction amount. The phase correction process may adjust each spectrum measurement so that the same signal appears with the same phase across all measurements. The processor 230 may generate phase-corrected spectrum measurements where signal components from different offset frequency measurements can be properly combined. The phase correction may enable the measurements to be aligned before combining them to achieve enhanced resolution.

In accordance with an embodiment, the processor 230 may be further configured to perform a weighted summation of the plurality of phase-corrected spectrum measurements to generate a combined spectrum measurement. The processor 230 may be configured to assign weight values to each phase-corrected measurement. The processor 230 may assign higher weights to measurements with better signal quality. The processor 230 may assign lower weights to measurements with more noise. The processor 230 may multiply each measurement by its weight value. The processor 230 may add all the weighted measurements together. The weighted summation may enhance good signals while reducing the effect of poor measurements. The processor 230 may generate a combined spectrum measurement that has better quality than individual measurements. For example, if measurement 1 has high signal quality, the processor 230 may assign it a weight of 0.4, measurement 2 with medium quality may receive a weight of 0.3, measurement 3 with lower quality may receive a weight of 0.2, and measurement 4 with poor quality may receive a weight of 0.1, wherein the weights total 1.0 for proper scaling. The processor 230 may determine signal quality by measuring specific characteristics of each spectrum measurement. The processor 230 may calculate signal-to-noise ratio (SNR) for each measurement, where measurements with SNR above 20 dB may be considered high quality, measurements with SNR between 10-20 dB may be medium quality, and measurements with SNR below 10 dB may be low quality. The processor 230 may measure noise floor levels in each measurement, where measurements with lower noise floors may receive higher weights. The processor 230 may multiply each measurement by its weight value, such as multiplying measurement 1 by 0.4, measurement 2 by 0.3, measurement 3 by 0.2, and measurement 4 by 0.1. The processor 230 may add all the weighted measurements together to create the final combined result.

In accordance with an embodiment, the processor 230 may be further configured to normalize the combined spectrum measurement to obtain the spectrum analysis output. The normalization may be useful because the weighted summation process may change the overall signal amplitude levels, making the combined result different from the original signal strengths. For example, if four measurements with weights of 0.4, 0.3, 0.2, and 0.1 are combined, the total weight sum may be 1.0, but the combining process may still alter the amplitude scaling due to constructive or destructive interference between measurements. The processor 230 may perform normalization by dividing the combined spectrum measurement by the sum of all weights used in the combination to ensure that the final amplitude levels accurately represent the original signal characteristics. The processor 230 may apply amplitude scaling corrections to compensate for any gain variations introduced during the weighted summation, where a signal that originally had −20 dBm power level may retain approximately −20 dBm in the normalized output rather than appearing artificially amplified or attenuated. The processor 230 may ensure consistent amplitude representation across all frequency bins. The normalization may prevent some frequencies from appearing stronger or weaker than they actually are due to the combining process. The normalization may provide the spectrum analysis output with proper signal level scaling and enhanced frequency resolution, enabling accurate signal detection and characterization that reflects true signal characteristics rather than processing artifacts.

In accordance with an embodiment, the local oscillator generator 214 may be further configured to dynamically adjust the defined frequency drift value based on signal characteristics in the spectrum analysis output. The local oscillator generator 214 may be configured to analyze the enhanced resolution spectrum analysis output to determine optimal frequency drift values that maximize resolution enhancement for detected signal characteristics. The local oscillator generator 214 may adjust the defined frequency drift value by decreasing the drift increment in the range of 10 Hz to 50 Hz, when the spectrum analysis output indicates closely spaced narrowband signals requiring finer resolution discrimination. The local oscillator generator 214 may adjust the defined frequency drift value by increasing the drift increment in the range of 100 Hz to 300 Hz from 10 Hz to 50 Hz when the spectrum analysis output shows widely spaced signals that can tolerate larger frequency steps for faster processing. The processor 230 may provide feedback to the local oscillator generator 214 regarding signal characteristics including signal bandwidth, frequency separation between detected signals, signal-to-noise ratio levels, and interference patterns identified in the enhanced resolution spectrum data. The local oscillator generator 214 may automatically modify the defined frequency drift value based on real-time analysis of spectrum characteristics. The input RF signals exhibiting rapid frequency changes may require smaller drift values for accurate tracking while stable signals may accommodate larger drift values for improved processing efficiency. The dynamic adjustment capability may enable the local oscillator generator 214 to optimize the trade-off between resolution enhancement accuracy and processing speed based on the specific signal environment, where the system 100 may achieve maximum resolution enhancement when needed while maintaining efficient processing when lower resolution is acceptable for the detected signal characteristics.

In accordance with an embodiment, the processor 230 may be configured to adjust multi-link operation (MLO) parameters in the wireless communication device 104A. The processor 230 may be configured to concurrently process the digitized IF signals in a first intermediate frequency band and a second intermediate frequency band corresponding to the defined intermediate frequencies, based on the adjusted MLO parameters in the wireless communication device 104A. The MLO parameters may include buffer sizes for each Intermediate Frequency (IF) band that determine temporary data storage capacity (e.g., configured as powers of 2, like 4096 or 8192 samples), Fast Fourier Transform (FFT) window parameters (including window size, overlap percentage, and window function type) that control frequency resolution and processing accuracy, sampling rates for each Analog-to-Digital Converter (ADC) of the ADC arrays 226 that determine data acquisition speeds (e.g., 160 MHz for 5 GHz band, 320 MHz for 6 GHz band), cross-correlation thresholds that define sensitivity for pattern detection between bands (typically ranging from 0.7 to 0.95 for correlation coefficients), and memory allocation settings for continuous FFT buffers that manage ongoing computations through circular buffer implementations and cache-aligned memory allocation. The MLO parameters configuration may operate in concert to enable efficient concurrent processing, maintain processing continuity, prevent data loss, optimize resource utilization, and ensure reliable cross-band correlation, with their specific values being tuned based on hardware capabilities, processing requirements, signal characteristics, and system performance targets. For example, the concurrent processing of digitized IF signals in 5 GHz and 6 GHz bands may be implemented by first adjusting (e.g., configuring) MLO parameters where the 5 GHz band may utilize a 4096-sample buffer with 160 MHz sampling rate and 1024-point FFT processing, while the 6 GHz band employs a larger 8192-sample buffer with 320 MHz sampling rate and 2048-point FFT to accommodate its higher bandwidth requirements. The processor 230 may maintain two concurrent processing paths, where the first path (e.g., the second WLAN radio chain 222B) may handle the 5 GHz IF signals with a correlation threshold of 0.85 and 75% FFT window overlap for enhanced temporal resolution in potentially noisier environments, while the second path (e.g., the third WLAN radio chain 222C) may process 6 GHz IF signals with a stricter 0.90 correlation threshold and similar 75% overlap for cleaner band operation.

In accordance with an embodiment, the MLO parameters adjustment may enable enhanced LO drifting implementation across multiple intermediate frequency bands by providing the processing framework useful for concurrent offset frequency measurements and combining operation. The processor 230 may utilize the configured buffer sizes and FFT parameters to concurrently execute multiple spectrum measurements with different offset frequencies within each intermediate frequency band. For example, the 5 GHz intermediate frequency band processing path may perform LO drifting using offset frequencies around the 5 GHz range such as 5.0000 GHz, 5.0001 GHz, and 5.0002 GHz while the 6 GHz intermediate frequency band processing path may concurrently perform its own LO drifting sequence using offset frequencies around the 6 GHz range such as 6.0000 GHz, 6.0001 GHz, and 6.0002 GHz. The cross-correlation thresholds and memory allocation settings may facilitate the storage and processing of phase coherence information from each offset frequency measurement across both intermediate frequency bands, enabling the processor 230 to maintain separate phase coherence data sets for each intermediate frequency band while performing concurrent coherent combining operations. The MLO parameters may coordinate the timing and resource allocation necessary for concurrent phase correction, weighted summation, and normalization operations across both intermediate frequency bands. The enhanced buffer sizes and optimized FFT window parameters may enable the processor 230 to achieve sub-FFT-bin resolution enhancement in both the 5 GHz and 6 GHz intermediate frequency bands concurrently. The concurrent processing capability enabled by the MLO parameter configuration may significantly improve system throughput by allowing multiple intermediate frequency bands to undergo LO drifting resolution enhancement concurrently rather than requiring sequential processing, thereby enabling real-time or near real-time enhanced resolution spectrum analysis across multiple intermediate frequency ranges using the same WLAN chipset (e.g., Wi-Fi 7 chipset hardware, such as the WLAN radio 244 and the WLAN modem 228).

In accordance with an embodiment, for the concurrent processing of the digitized IF signals for the spectrum monitoring, the processor 230 may be further configured to execute a sliding window Fast Fourier Transform (FFT) operation on the digitized IF signals from each of the first intermediate frequency band and the second intermediate frequency band. The processor 230 may be further configured to maintain a continuous FFT buffer for each of the first intermediate frequency band and the second intermediate frequency band. The processor 230 may be further configured to compute cross-correlation coefficients between FFT outputs of the first intermediate frequency band and the second intermediate frequency band to detect temporal signal patterns. In other words, for spectrum monitoring, the processor 230 may continuously execute sliding window FFT operations on both bands concurrently, maintaining separate circular FFT buffers (4 memory blocks for 5 GHz, 8 for 6 GHz) to store historical FFT outputs, and compute cross-correlation coefficients between the bands with a minimum confidence threshold of 0.90 to detect temporal signal patterns and potential interference. The cross-correlation coefficients may measure the similarity between signals in two different frequency bands (e.g., in this case, 5 GHz and 6 GHz) at different time shifts. The coefficient may range from −1 to 1, where “1” may indicate a perfect correlation (i.e. signals are very similar), “0” may indicate no correlation (i.e. signals are unrelated); and “−1” may indicate perfect negative correlation (i.e. signals are inversely related). The correlation coefficient calculation may normalize both signals, compute their dot product, and compare against the threshold (0.90). This MLO-based concurrent processing enables real-time spectrum analysis across both bands while optimizing resource utilization through band-specific parameter tuning, achieving enhanced spectrum monitoring capabilities through concurrent pattern detection and cross-band correlation analysis.

In accordance with an embodiment, the processor 230 may be further configured to perform a cross-band correlation between the processed digitized IF signals from the first intermediate frequency band and the second intermediate frequency band to identify related signal patterns. By taking the example of the cross-band correlation between 5 GHz and 6 GHz intermediate frequency bands, the related signal pattern may be identified by analyzing the temporal and spectral relationships between the processed digitized IF signals from both bands. The processor 230 may normalize the FFT outputs from both bands to account for power level differences and then may compute cross-correlation coefficients using a sliding window approach with a defined confidence threshold, for example, 0.90 confidence threshold. The related signal patterns may be identified through several key characteristics, such as temporal synchronization (e.g. where similar signal bursts appear in both bands with minimal time delay), spectral similarity (e.g. matching frequency components across bands indicating potential interference or legitimate multi-band transmissions), and amplitude correlation (e.g. relative signal strength patterns that occur simultaneously). For example, when a correlation coefficient exceeds 0.95, it might indicate strong cross-band interference such as certain microwave emissions affecting both bands, while coefficients between 0.90 and 0.95 could suggest legitimate Wi-Fi® traffic utilizing both bands for MLO operation. The processor 230 may maintain a pattern history buffer in the pattern recognition database 238 for each band and employ adaptive thresholding to distinguish between different types of related patterns, such as periodic interference (i.e., showing regular temporal patterns), burst transmissions (i.e., appearing as correlated spikes across bands), or continuous signal presence (i.e., sustained high correlation over extended periods), enabling real-time identification and classification of multi-band signal relationships.

In accordance with an embodiment, the processor 230 may be further configured to perform real-time or near real-time enhanced resolution spectrum monitoring based on the processed digitized IF signals using the LO drifting operation. The real-time enhanced resolution spectrum monitoring may enable detection and analysis of narrowband signals with frequency resolution exceeding the base FFT capability while maintaining low processing latency suitable for dynamic spectrum environments requiring enhanced signal discrimination. The enhanced spectrum monitoring process may include LO drifting-based signal analysis, wherein multiple spectrum measurements using offset frequencies with defined frequency drift values may be processed through coherent combining operation to achieve sub-FFT-bin resolution. For example, the processor 230 may execute 1024-point FFT operations on each offset frequency measurement while achieving effective resolution of 50 kHz or finer through phase coherence analysis, compared to the base 312.5 kHz resolution of individual FFT operations. The enhanced spectrum monitoring process may include enhanced signal detection and classification based on the improved frequency resolution capability, enabling identification of narrowband interference, frequency-agile transmissions, and closely spaced signal components that would be undetectable using conventional FFT processing alone. The real-time processing capability may maintain processing latency under 5 microseconds while providing resolution enhancement factors of 2× to 12× beyond the base Wi-Fi® 7 chipset FFT capability through the LO drifting and combining operation.

In accordance with an embodiment, the processor 230 may be further configured to update a database of historical signal correlation patterns (i.e., the pattern recognition database 238), after each event of the cross-band correlation. The processor 230 may be further configured to execute a trained artificial neural network model, i.e., the ANN model 232 on the spectrum analysis output to identify recurring signal patterns. In an implementation, the recurring signal patterns may be identified at each event of the cross-band correlation. The processor 230 may input the enhanced resolution spectrum analysis output generated through the LO drifting and the combining operation into the trained ANN model 232 for pattern recognition analysis. The ANN model 232 may be configured to analyze the enhanced frequency resolution data to identify specific signal characteristics, modulation patterns, and spectral signatures that indicate particular signal types or sources. The processor 230 may utilize the ANN model 232 to classify signals based on their enhanced resolution spectral features. The processor 230 may utilize the ANN model 232 to automatically identify and categorize narrowband signals, frequency-agile transmissions, and interference patterns. The trained ANN model 232 may process the spectrum analysis output containing sub-FFT-bin resolution information to detect signal patterns that would be unidentifiable in conventional FFT analysis due to insufficient frequency resolution. The processor 230 may execute the ANN model 232 to recognize recurring patterns in the enhanced resolution spectrum data, enabling automated detection of specific transmission types, interference sources or anomalous signal behaviors.

In accordance with an embodiment, the processor 230 may be further configured to classify signals in the spectrum analysis output based on the identified recurring signal patterns. The classified signals may include one or more of legitimate signal communications (e.g., from legitimate signal sources 108), potential jamming signals (e.g., from the signal jamming sources 110), frequency hopping transmissions (e.g., from the moving interference sources 114), or unknown or anomalous signals tagged for further analysis (e.g., from the unknown signal sources 112). The processor 230 may utilize the enhanced frequency resolution spectrum data (i.e., the spectrum analysis output) generated through the LO drifting and combining operation to perform signal classification with improved accuracy compared to conventional FFT-based analysis. The processor 230 may classify legitimate signal communications by identifying spectral characteristics that match known communication protocols and regulatory compliance patterns, where signals exhibiting proper bandwidth usage, standard modulation schemes, and authorized frequency allocations may be categorized as legitimate transmissions. The processor 230 may identify potential jamming signals by detecting spectral signatures indicating intentional interference activities, such as broadband noise patterns, swept frequency signals, or high-power transmissions designed to disrupt communication channels. The processor 230 may recognize frequency hopping transmissions by analyzing the enhanced resolution spectrum data for rapid frequency changes and coordinated transmission patterns that indicate frequency-agile communication systems. The processor 230 may tag unknown or anomalous signals for further analysis when the enhanced resolution spectrum data reveals signal characteristics that do not match known patterns in the training database, enabling identification of novel transmission types or potential security threats. The signal classification process may leverage the sub-FFT-bin resolution capability provided by the LO drifting operation to distinguish between closely spaced signals and identify narrowband transmissions that would be undetectable or misclassified using conventional spectrum analysis methods, thereby improving threat detection and spectrum management capabilities in military, security, and regulatory applications.

In accordance with an embodiment, the processor 230 may be further configured to control the wireless communication device 104A to trigger an operational response based on the classified signals and the cross-band correlation. The operational response may include at least one of a spectrum monitoring and management action, a dynamic spectrum reallocation action to adjust spectrum resources to optimize network performance and reduce interference, or a distribution of spectrum monitoring information across a plurality of other wireless communication device 104. As in the wireless mesh network 106. In accordance with an embodiment, the spectrum monitoring and management action may be at least one of: selection of a frequency band and a polarization type at the wireless communication device 104A for data communication above a defined data throughput, adjustment of spectrum analysis parameters at the wireless communication device 104A or tracking and characterization of threat signals in a contested spectrum environment.

In an example, when the classified signals are legitimate signal communications (e.g., from legitimate signal sources 108), the processor 230 may be further configured to select optimal frequency bands for signal monitoring while maintaining current communication links, and adjust filter parameters of the plurality of band filters 212 and correlation thresholds in the cross-correlation to maintain signal quality based on validated patterns. The processor 230 may optimize spectrum resource allocation to enhance network performance. For example, in order to optimize band selection, the processor 230 may switch between 2.4/5/6 GHz bands based on interference levels. In another example, in order to optimize band selection, the processor 230 may dynamically select 6 or 7 GHz for 320 MHz bandwidth when higher throughput needed from a current throughput state or may switch back to 5 GHz for 160 MHz bandwidth when appropriate (e.g., throughput need decreased) or fall back to 2.4 GHz band when needed for redundancy. Further, in order to optimize resolution, the processor 230 may select between 19 kHz, 39 kHz, or 75 kHz subcarrier spacing in an example. In another example, the same data item may be sent via the first intermediate frequency band the second intermediate frequency band to not only improve reliability through redundant processing paths but also provide periodically cross-validation of signal characteristics which in turn enhances detection accuracy through multiple observations and provides better immunity against band-specific interference. Further, other operational responses when the classified signals are legitimate signal communications (e.g., from legitimate signal sources 108) may include but are not limited to spectrum usage coordinate and legitimate signal information sharing with other wireless communication devices 104B, 104C, . . . , 104N in the wireless mesh network 106, update of the pattern database with confirmed legitimate signal signatures, continuous spectrum monitoring to track signal characteristic changes, operational parameters adaptation based on evolving signal conditions. These actions may collectively ensure reliable handling of legitimate communications while optimizing system awareness and performance.

In another scenario, when the classified signals are potential jamming signals, the processor 230 may be configured to perform one or more of the following operational responses or actions: execute null steering through adaptive beamforming to minimize jamming signal reception while maintaining tracking of the moving interference sources 114; optimize filter configurations and LO parameters for enhanced jamming rejection; may update detection parameters and correlation thresholds based on identified jamming patterns; generate alerts when energy patterns match defined jamming threat criteria; may continuously monitor spectral density variations to assess jamming effectiveness; and adapt bandwidth allocation to maintain optimal network performance in presence of jamming signals. These coordinated actions may enable effective jamming mitigation while maintaining network operation.

In yet another scenario, when the classified signals are the frequency hopping transmissions (e.g., from the moving interference sources 114), the processor 230 may dynamically adjust bandwidth and correlation parameters to maintain tracking as frequencies change. The processor 230 may perform cross-band correlation to validate detected frequency hops. The processor 230 may further execute adaptive beamforming to maintain signal reception across frequency transitions. The processor 230 may further update the pattern recognition database 238 with newly identified hopping sequences. The processor 230 may further share hopping pattern information across the wireless mesh network 106 for coordinated monitoring. The processor 230 may generate alerts if hopping patterns match threat criteria. The processor 230 may further adapt spectrum allocation to minimize interference with legitimate communications. These coordinated actions may enable effective tracking and response to frequency hopping signals.

In another scenario, when the classified signals are the unknown or anomalous signals tagged for further analysis (e.g., from the unknown signal sources 112), the processor 230 may be configured to generate the following operational response (or perform the following actions): execute enhanced cross-band correlation across both intermediate frequency bands to gather additional signal characteristics; perform high-resolution spectral analysis by adjusting subcarrier spacing and LO drifting parameters; compare signal patterns against the pattern recognition database 238 using the trained ANN model 232 for potential matches; collect and store detailed signal parameters including modulation, timing, and frequency characteristics for further analysis; distribute anomalous signal information across the wireless mesh network 106 to gather correlated observations; generate alerts for persistent unknown patterns; adapt signal detection thresholds for the unknown or anomalous signals to improve sensitivity for similar future signals; and maintain continuous monitoring of the identified frequency bands where unknown signals were detected. These actions may enable comprehensive characterization and tracking of unknown signal sources.

In accordance with an embodiment, the processor 230 may be further configured to generate threat assessments based on the classified signals. The control of the wireless communication device 104A to trigger the operational response is further based on the generated threat assessments. The threat assessments may be based on real-time analysis of classified signals. The threat classification may be jamming detection, protocol violations, such as unauthorized or anomalous network behaviors, behavioral anomalies (e.g., using the ANN model 232 to recognize deviations from expected RF patterns), or signal origin tracking (e.g., locating sources of threats using multi-node triangulation and spatial processing). The processor 230 may be further configured to generate one or more alerts when the correlated energy patterns match a defined threat criteria as the operational response.

In accordance with an embodiment, the training of the ANN model 232 for enhanced resolution spectrum monitoring may be performed using labeled training datasets that may include, for example, 10,000 to 100,000 spectrum samples. Each sample may include enhanced resolution spectrum analysis output generated through the LO drifting and combining operation with 1024 to 4096 frequency bins, phase coherence coefficients normalized between 0 and 1, and corresponding ground truth classification labels. In an example, the ANN model 232 may implement a multi-layer neural network architecture comprising 3 to 5 convolutional layers with 32 to 128 filters for spectral feature extraction, 2 to 3 Long Short-Term Memory (LSTM) layers with 64 to 256 memory units for temporal pattern analysis, and fully connected layers with 128 to 512 neurons for classification processing. The training datasets may include spectrum analysis outputs from legitimate signal communications, jamming signals, frequency hopping transmissions, and unknown signal patterns captured across various signal-to-noise ratios ranging from 5 dB to 40 dB and different environmental conditions. The input features may include enhanced resolution frequency domain data, phase coherence information from offset frequency measurements, and spectral energy distributions that are available only through the LO drifting operation and the combining operation.

In accordance with an embodiment, the training process of the ANN model 232 may utilize supervised or semi-supervised learning algorithms with learning rates between 0.001 to 0.01, batch sizes of 32 to 128 samples, and 50 to 200 training epochs with early stopping criteria based on validation accuracy improvements plateauing within 0.1% over 10 consecutive epochs. The processor 230 may implement data preprocessing including normalization of enhanced resolution spectrum data between 0 and 1, extraction of phase coherence features from the stored phase coherence information, and conversion of spectral data into tensor formats suitable for neural network processing. The training methodology may include data augmentation techniques such as adding Gaussian noise with standard deviation of 0.01 to 0.05 to spectrum data, rotating phase values by ±10 degrees, and varying offset frequency sequences to improve model robustness and generalization capability. The ANN model 232 may achieve classification accuracy of 90% to 98% for signal pattern recognition using enhanced resolution features, where the sub-FFT-bin resolution information enables detection of spectral characteristics that conventional FFT-based training data cannot provide.

In accordance with an embodiment, the trained ANN model 232 may be validated using separate test datasets containing 20% to 30% of the total labeled samples, wherein performance metrics may include classification accuracy, precision, recall, and F1-score measurements for each signal category including legitimate communications, jamming signals, frequency hopping transmissions, and unknown signals. The processor 230 may implement model optimization techniques including weight pruning to reduce computational complexity, quantization to 8-bit or 16-bit precision for efficient inference, and transfer learning approaches that adapt pre-trained models to specific spectrum monitoring applications. The trained model may be deployed for real-time inference on enhanced resolution spectrum analysis outputs, where the processing latency may be maintained under 10 milliseconds per classification decision while providing automated signal identification capabilities that exceed conventional spectrum analysis methods through utilization of the enhanced frequency resolution and phase coherence information provided by the LO drifting and combining operation. By leveraging the Peltbeam's ANN model, such as the ANN model 232, wireless spectrum monitoring, signal identification, and interference analysis may be significantly enhanced across a wide range of frequency bands (DC to 300 GHz).

Figure 3:
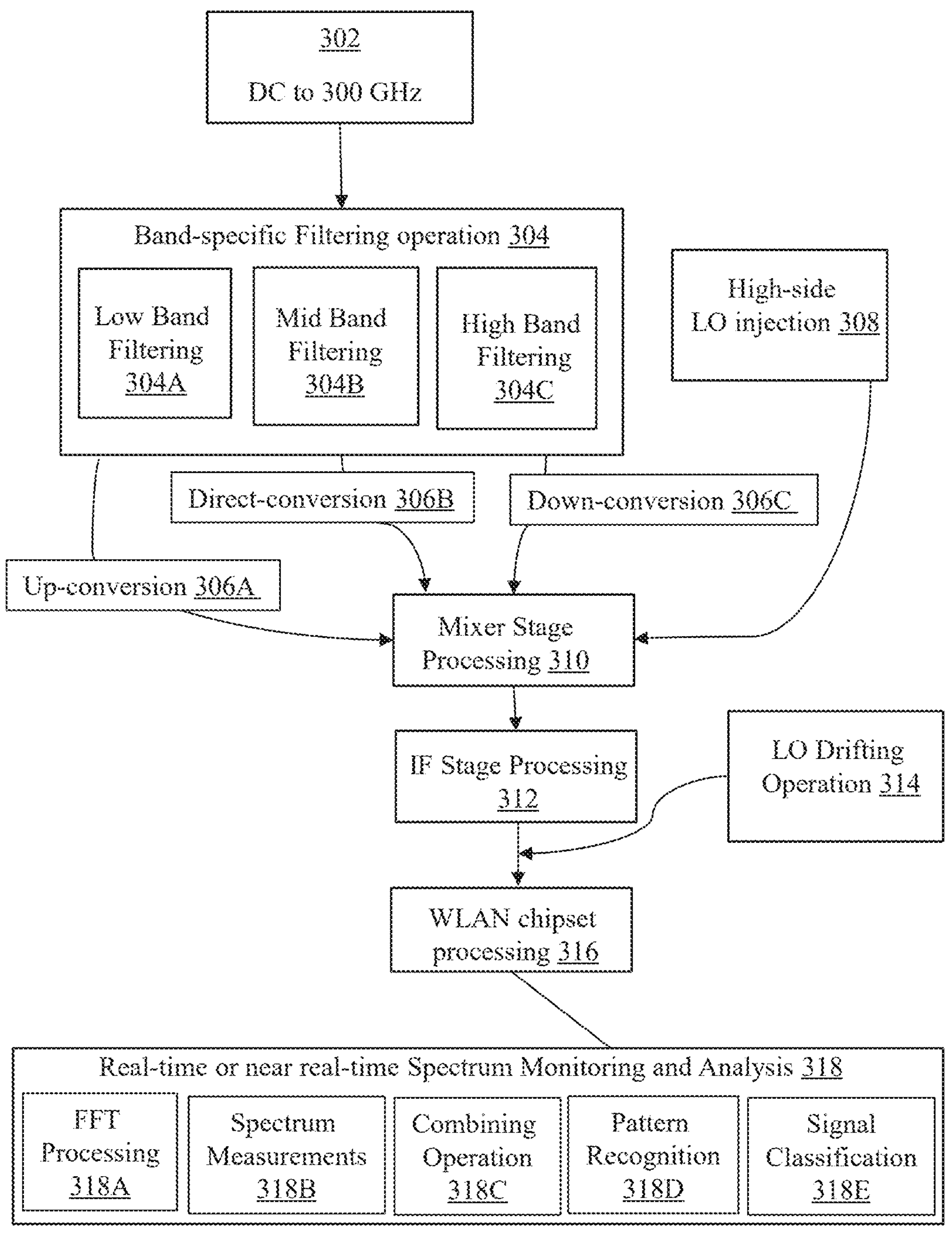
FIG. 3 is a diagram that illustrates an exemplary scenario for implementation of a wireless communication device for enhanced resolution spectrum monitoring, in accordance with an exemplary embodiment of the disclosure.

FIG. 3 is a diagram that illustrates an exemplary scenario for implementation of a wireless communication device for enhanced resolution spectrum monitoring, in accordance with an exemplary embodiment of the disclosure. FIG. 3 is explained in conjunction with elements from FIGS. 1 and 2. With reference to FIG. 3, there is shown an exemplary signal processing pipeline using operations 302 to 318 for an exemplary scenario of universal or wideband spectrum monitoring, such as monitoring of spectrum ranging from DC to 300 GHz, with enhanced resolution.

In an exemplary scenario, the wireless communication device 104A may employ the intelligent frequency shifting operation to map any frequency from DC to 300 GHz into the processing range of the WLAN chipset (e.g., Wi-Fi® 7/6E chipset). The high-side local oscillator (LO) frequency injection at operation 308 may be intelligently used to push image frequencies above 9.8 GHz, where such image frequencies experience natural attenuation and are discarded, which in turn simplifies filtering requirements and ensures clean signal conversion. The frequency shifting architecture enables the system 100 or specifically the wireless communication device 104A to achieve wideband spectrum monitoring with high sensitivity and dynamic range while utilizing the processing capabilities of a Wi-Fi® 7 chipset. Furthermore, the LO drifting operation at operation 314 may enhance the resolution of spectrum monitoring which may detect closely spaced signals in the frequency domain with almost 2× to 12× better than conventional spectrum analyzers using WLAN chipset.

At operation 302, the one or more antenna arrays 204 may be configured to receive the radio frequency (RF) signals across a plurality of frequency bands in a range of direct current (DC) to 300 gigahertz (GHz). The one or more antenna arrays 204 may include the plurality of dual-polarized antennas 206 configured to capture the RF signals in vertical and horizontal polarizations across the plurality of frequency bands for enhanced signal diversity.

At operation 304, the band-specific filtering operation (e.g., low band, mid band, and high band filtering) may be applied on the received RF signals across the plurality of frequency bands to obtain filtered RF signals. The plurality of band filters 212 may be configured to apply the band-specific filtering operation to the received RF to obtain the filtered RF signals.

At operation 304A, a low-band filtering may be executed. The plurality of band filters 212 may include the first band filter 212A (e.g., a low-band filter) configured to process the received RF signals in a first frequency range. In an implementation, the first frequency range may be 1 hertz (Hz) to 1 GHz or 50 MHz to 2.2 GHz.

At operation 304B, a mid-band filtering may be executed. The plurality of band filters 212 may further include the second band filter 212B (e.g., a mid-band filter) configured to process the received RF signals in a second frequency range, where the second frequency range may be higher than the first frequency range. In an example, the second frequency range may be 1.1 to 3 GHz or 2.4 GHz to 7 GHz.

At operation 304C, a high-band filtering may be executed. The plurality of band filters 212 may further include the third band filter 212C (e.g., a high-band filter) configured to process the received RF signals in a third frequency range, where the third frequency range may be higher than the second frequency range. In an example, the third frequency range may be between 3.1 GHz to 300 GHz or 7.2 GHz to 300 GHz. The band-specific filtering operation may include determining an input RF signal frequency and directing the input RF signal through one of three concurrent filtering paths based on the frequency range.

At operation 306A, up-conversion may be performed where the filtered RF signals from the low-band filtering may be upconverted to a predetermined frequency range (i.e., one of 2.4 GHz, 5 GHz, 6 GHz, or 7 GHz). At operation 306B, a direct-conversion may be performed where the filtered RF signals from the mid-band filtering may be directly converted (if needed) to a predetermined frequency range (i.e., one of 2.4 GHz, 5 GHz, 6 GHz, or 7 GHz). At operation 306C, down-conversion may be performed where the filtered RF signals from the high-band filtering may be down-converted to a predetermined frequency range (i.e., one of 2.4 GHz, 5 GHz, 6 GHz, or 7 GHz).

At operation 308, a high-side local oscillator frequency injection may be performed. The local oscillator generator 214 may be configured to generate tunable local oscillator frequencies above a threshold frequency, such as 9.8 GHz. The circuitry 246 may be further configured to determine an input RF signal frequency of the received RF signals from among the plurality of frequency bands of Dc to 300 GHz and then perform the high-side local oscillator frequency injection.

At operation 310, a mixer stage processing may be performed. In the mixer stage processing, the circuitry 246 may be configured to execute a frequency shifting operation in one or more frequency conversion stages in which one or more tuned local oscillator frequencies above the threshold frequency may be injected at the circuitry 246 to push image frequencies above the threshold frequency and shift the filtered RF signals to defined intermediate frequencies. The frequency shifting operation may include either one or multiple frequency conversion stages, where each conversion stage may be configured to translate a received RF signal to a predetermined intermediate frequency through strategic local oscillator injection. The local oscillator frequencies may be adjusted in real-time based on the detected input signal frequency, desired intermediate frequency for processing, required image frequency suppression, and phase noise optimization requirements.

Typically, WLAN chipsets like Wi-Fi® 7 chips may only process certain frequencies (like 2.4 GHz, 5 GHz, 6 or 7 GHz). However, if many other frequencies (up to 300 GHz) are to be monitored then these other frequencies may be converted intelligently so the WLAN chipsets (e.g., the WLAN radio 244 and the WLAN modem 228) may process them.

In an example, the circuitry 246 may be configured to execute a multi-stage frequency shifting operation, where for signals in different frequency ranges, the following conversions may be implemented. For example, for signals at 100 GHz, a first stage conversion may inject an 85 GHz local oscillator frequency to achieve a difference frequency of 15 GHz (100 GHz−85 GHz=15 GHz) while producing an image frequency at 185 GHz (100 GHz+85 GHz=185 GHz), followed by a second stage employing a 9 GHz local oscillator frequency to convert the 15 GHz signal to a final intermediate frequency of 6 GHz (15 GHz−9 GHz=6 GHz), with the second image at 24 GHz image frequency (15 GHz+9 GHz=24 GHz) experiencing natural attenuation. The final intermediate frequency of 6 GHz may be one of the intermediate frequencies.

In another example, for signals at 50 GHz, the circuitry 246 may employ a first stage conversion using a 41 GHz local oscillator frequency to produce a difference frequency of 9 GHz (50 GHz−41 GHz=9 GHz) with an image at 91 GHz (50 GHz+41 GHz=91 GHz), followed by a second stage using a 4 GHz local oscillator frequency to achieve a final intermediate frequency of 5 GHz (9 GHz−4 GHz=5 GHz) with a second image at 13 GHz (9 GHz+4 GHz=13 GHz). The final intermediate frequency of 5 GHz may be one of the defined intermediate frequencies.

In yet another example, for processing a 28 GHz signal using a WLAN chipset limitations (which can only process 2.4 GHz, 5 GHz, and 6 GHz), the frequency shifting operation in a single conversion stage may be exemplified as follows. For an input RF signal frequency (FRF) of 28 GHz, the system 100 performs the conversion by injecting a tuned local oscillator frequency (FLO) of 23 GHz (which is above the threshold frequency of 9.8 GHz). The difference frequency (desired or predetermined IF) may be 5 GHz (i.e., 28−23=5 GHz) which matches Wi-Fi® 7 processing capability). The image frequency may be 51 GHz (i.e., sum of 23 GHz+28 GHz=51 GHz (Naturally attenuated)). The frequency shifting operation may maintain FLO+FRF>threshold frequency (9.8 GHz), thereby converting the 28 GHz signal to a 5 GHz intermediate frequency that may be directly processed by the WLAN chipset (e.g., Wi-Fi® 7 chipset), while pushing the image frequency to 51 GHz where it experiences natural attenuation, thus eliminating the need for complex image rejection filtering while enabling efficient processing of the 28 GHz signal through WLAN chipset.

In accordance with an embodiment, the circuitry 246 may be configured to execute a frequency shifting operation for a 300 GHz signal through multiple practical frequency conversion stages, wherein a first conversion stage may employ a frequency divider to create a 50 GHz intermediate signal (300 GHz÷6), followed by mixing with a tuned local oscillator frequency of 45 GHz (above threshold frequency of 9.8 GHz) to generate a 5 GHz intermediate frequency (|45 GHz−50 GHz|=5 GHz), while pushing the image frequency to 95 GHz (45 GHz+50 GHz) where natural attenuation occurs. The operation may further include a second conversion stage wherein the 5 GHz intermediate frequency may or may not be mixed with a second local oscillator at 11 GHz to produce a final intermediate frequency of 6 GHz (|11 GHz−5 GHz|) suitable for Wi-Fi® 7 processing, while pushing the second image frequency to 16 GHz (11 GHz+5 GHz) where natural attenuation occurs, thereby enabling efficient processing of extremely high frequency signals through practical local oscillator frequencies and frequency division while maintaining all image frequencies above the threshold frequency where natural attenuation occurs, thus achieving effective conversion to Wi-Fi®-compatible frequencies using realizable components. In another example, the frequency divider may not be used, and multiple high-side local oscillator frequency injections may be done.

At operation 312, an intermediate frequency (IF) stage processing may be performed. In the IF stage processing, the circuitry 246 may be further configured to convert the filtered RF signals to one or more defined intermediate frequencies, for example, a common intermediate frequency (e.g., 6 GHz) or different defined intermediate frequencies (e.g., 2.4 GHz, 5 GHz, or 6 GHz compatible with WLAN chipset processing) as a result of the operation 310.

At operation 314, a local oscillator (LO) drifting operation may be executed. In the LO drifting operation, the LO generator 214 may be further configured to generate a sequence of offset frequencies for processing RF signals that are converted to the one or more intermediate frequencies (e.g., 2.4 GHz, 5 GHz, or 6 GHz). Each offset frequency in the sequence of offset frequencies may differ from adjacent offset frequencies by a defined frequency drift value (e.g., by incrementing with predetermined value or step size, for example, about 10 Hz to 500 Hz increments). Each offset frequency in the sequence of the offset frequencies may enable multiple spectrum measurements of the same 2.4

GHz, 5 GHz, or 6 GHz intermediate frequency signal with different phase characteristics.

At operation 316, WLAN chipset processing may be executed. The circuitry 246 (or one or more ADCs) may be further configured to digitize the filtered RF signals at the one or more intermediate frequencies (IFs) to obtain digitized intermediate frequency signals. The filtered RF signals at the defined intermediate frequencies may be the converted IF signals but still in the analog form at the operation 312, which may then be processed through an Analog-to-Digital Converter (ADC) that may sample and convert the analog IF signals into digital form, thereby obtaining the digitized IF signals. The RF band mapper 220 in the RF front-end 208 may be further configured to demultiplex the digitized IF signals into one or more different wireless local area network (WLAN) frequency channels, such as 2.4 GHz, 5 GHz, or 6 GHz and assign a distinct signal processing path to each of the one or more different WLAN frequency channels.

At operation 318, a real time or near real-time spectrum monitoring and analysis operation may be performed. At operation 318A, Fast Fourier Transform (FFT) processing may be performed for signal processing for a spectrum measurement. At operation 318B, spectrum measurements may be performed. The processor 230 may be further configured to perform a plurality of spectrum measurements for the digitized IF signals. Each spectrum measurement of the plurality of spectrum measurements may be based on a different offset frequency of the sequence of offset frequencies. Each spectrum measurement may be associated with a first frequency resolution (e.g., 312 MHz for 6 GHz spectrum). The processor 230 may be further configured to store phase coherence information for each spectrum measurement of the plurality of spectrum measurements. At operation 318C, a combining operation may be executed. In the combine operation, the processor 230 may be further configured to combine the plurality of spectrum measurements based on the stored phase coherence information to generate a spectrum analysis output with a second frequency resolution (e.g., 10 Hz to 100 Hz) that exceeds the first frequency resolution. The wireless communication device 104A may achieve resolution enhancement by a factor of approximately 12× through phase coherence analysis of the offset frequency sequence without requiring larger FFT processing or custom hardware modifications beyond the existing Wi-Fi® 7 chipset capabilities. At operation 318D, pattern recognition may be performed. The processor 230 may be configured to execute the trained ANN model 232 to identify recurring signal patterns. At operation 318E signal classification may be performed. The processor 230 may be further configured to classify signals based on the identified recurring signal patterns. The classified signals may include one or more of: legitimate signal communications (e.g., from legitimate signal sources 108), potential jamming signals (e.g., from the signal jamming sources 110), frequency hopping transmissions (e.g., from the moving interference sources 114), or unknown or anomalous signals tagged for further analysis (e.g., from the unknown signal sources 112).

In contrast to conventional systems and devices (e.g. conventional spectrum analyzers) requiring dedicated hardware for different frequency bands, the wireless communication device 104A advantageously utilizes WLAN chipsets (e.g., IEEE 802.11be chipset and modems) with intelligent signal down conversion and signal processing architectures as described to achieve wide frequency range coverage (DC to 100 or 300 GHz) in a cost-effective manner. The received RF signals captured from air of 0-100+ GHz may be converted and digitized to desired intermediate frequencies, for example, frequencies like (5 GHz and/or 6 GHz) capable of being processed firstly in the WLAN chipset, which not only simplifies the signal processing but also reduces the cost effectively without any compromise in spectrum analysis results. For example, there is no need for expensive ADCs to manage high-bandwidth signal capture (e.g., >7 GHz) directly, and complex signal processing hardware due to conversion to desired intermediate frequencies.

Furthermore, conventional Wi-Fi® 7 chipsets that operate in the 6 GHz band with 320 MHz sample rate and typical 1024-point FFT processing achieve a base frequency resolution of 312.5 kHz (e.g., 320,000,000 Hz (320 MHz) divided by 1024 is equal to 312,500 Hz, i.e., 312.5 kHz). The frequency resolution limitation prevents the chipset from distinguishing between signals separated by less than 312.5 kHz, causing them to appear as a single blurred spectral component. For example, two narrowband interference signals at 6.1000 GHz and 6.1001 GHz (separated by only 100 kHz) would be detected as one signal because their 100 kHz separation is below the 312.5 kHz resolution threshold, limiting the system's ability to identify and characterize narrowband threats or interference sources critical in security and spectrum monitoring applications. In contrast to the conventional systems, the wireless communication device 104A of the present disclosure allows for detailed signal analysis and characterization without requiring larger FFT sizes or custom hardware, improving the system's ability to detect and analyze narrowband signals. The use of different offset frequency may overcome the limitation that frequency resolution equals sample rate divided by FFT size, enabling enhanced resolution without requiring larger FFT processing or custom digital signal processing hardware. For example, while a Wi-Fi® 7 chipset with 320 MHz sample rate and 1024-point FFT has a base resolution limitation of 312.5 kHz, the LO drifting operation (e.g., using different offset frequencies for spectrum measurements and combining of the spectrum measurements) can distinguish signals separated by significantly less than the limit (e.g., the base resolution limitation of 312.5 kHz) by extracting sub-bin frequency information from the phase relationships, enabling detection and characterization of narrowband signals that would otherwise appear as a single blurred component in conventional single-measurement FFT analysis.

Figure 4A:
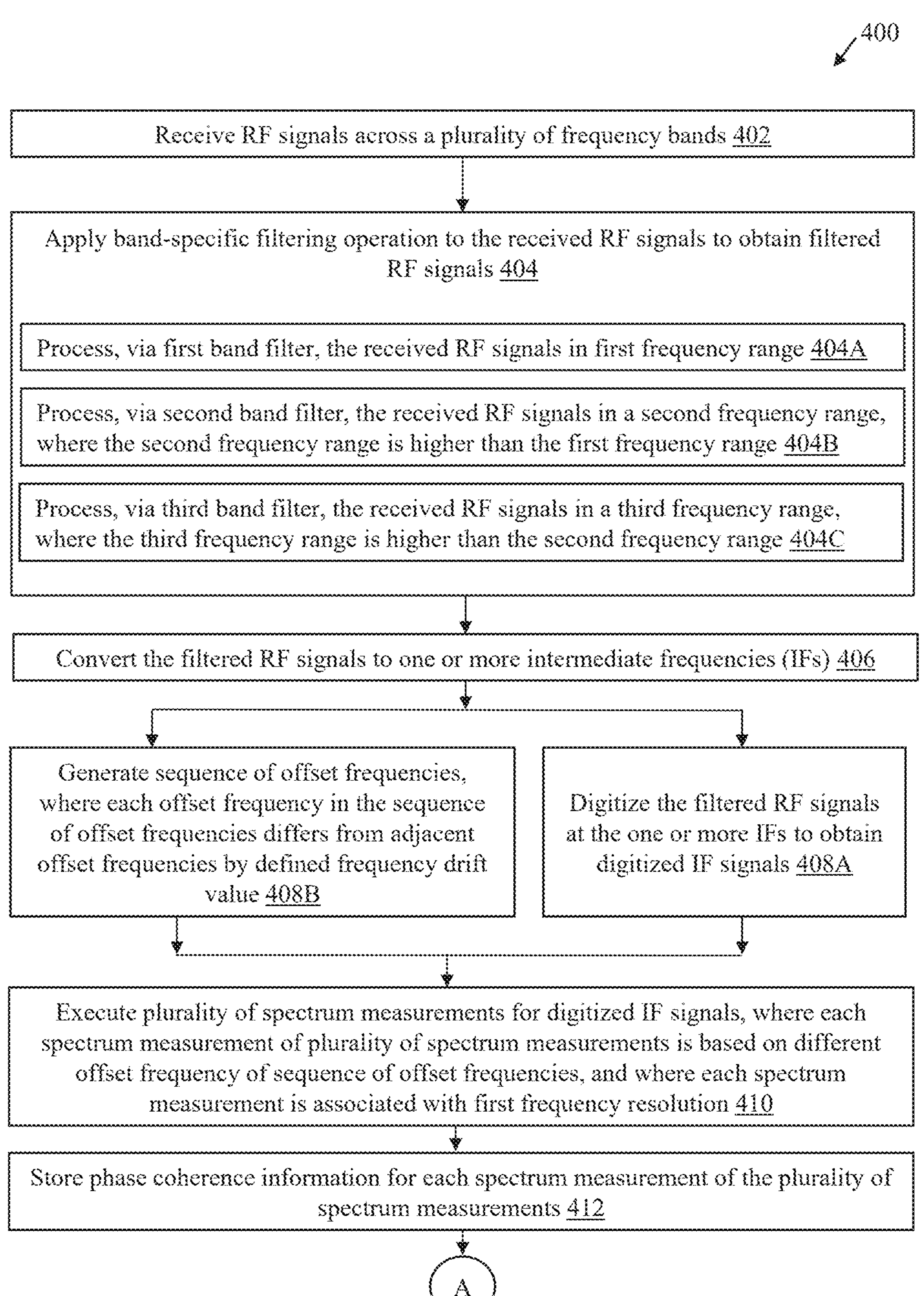
FIG. 4A, FIG. 4B, and FIG. 4C are diagrams that collectively illustrate a flowchart of a method for enhanced resolution spectrum monitoring, in accordance with an embodiment of the disclosure.
Figure 4B:
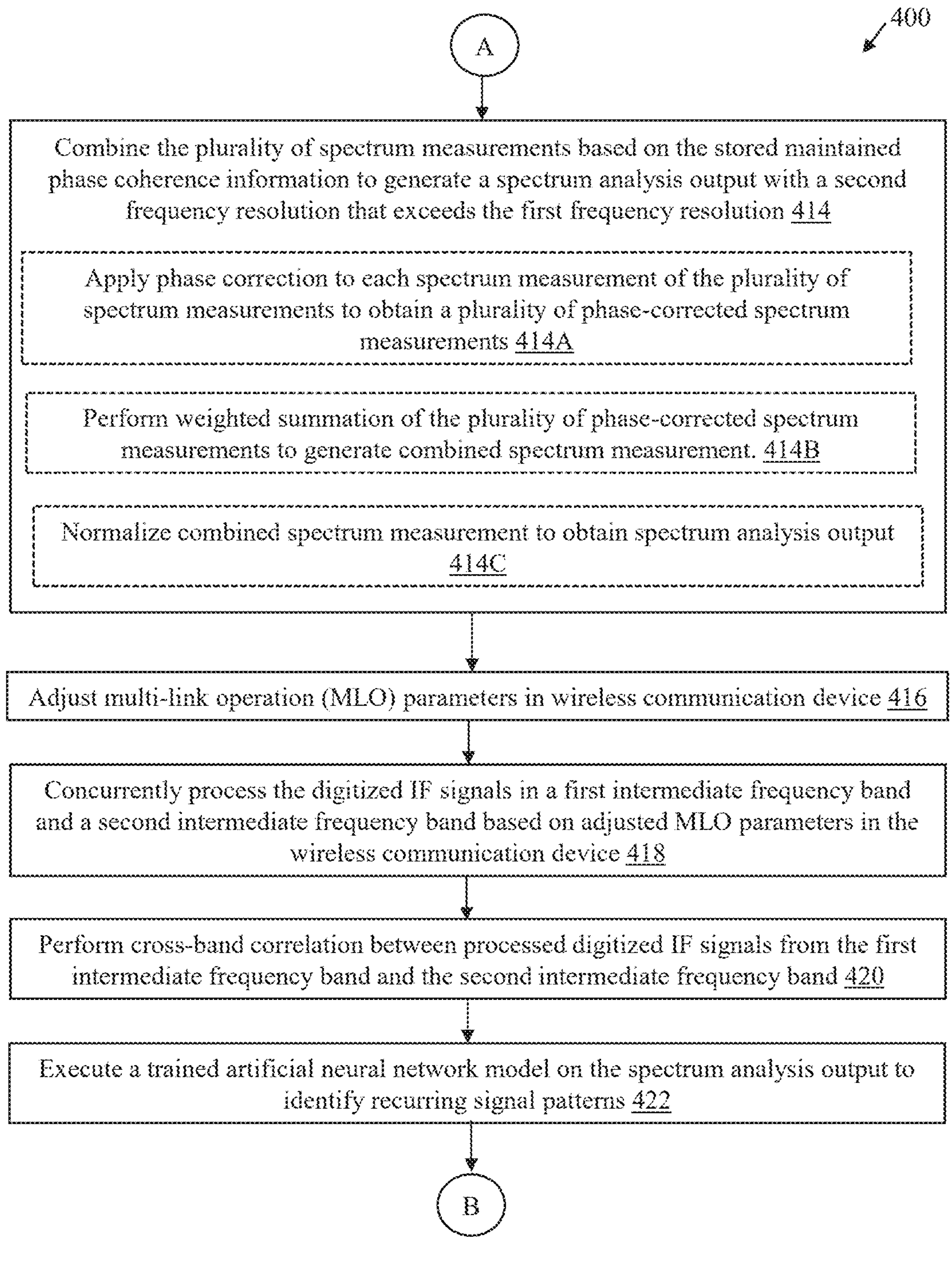
Figure 4C:
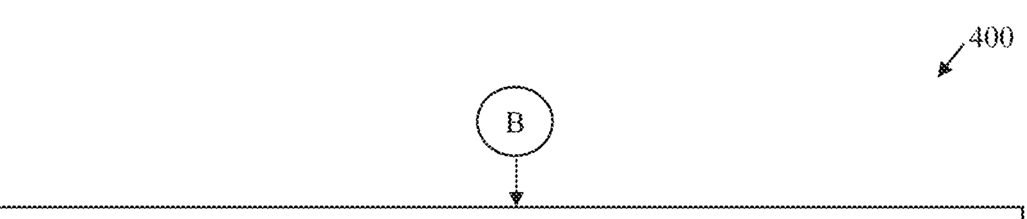

FIG. 4A, FIG. 4B, and FIG. 4C are diagrams that collectively illustrate a flowchart of a method for enhanced resolution spectrum monitoring, in accordance with an embodiment of the disclosure. FIG. 4A, FIG. 4B, and FIG. 4C are explained in conjunction with elements from FIGS. 1, 2, and 3. With reference to FIG. 4A, FIG. 4B, and FIG. 4C, there is shown a flowchart of a method 400 including exemplary operations 402 through 426. The method 400 may be implemented in any of the wireless communication devices 104A, 104B, 104C, . . . , 104N. With reference to FIG. 4A, operations 402 to 412 are shown.

At operation 402, radio frequency (RF) signals may be received across a plurality of frequency bands (e.g., in a range of DC to 300 GHz). The one or more antenna arrays 204 may include the plurality of dual-polarized antennas 206 configured to capture the RF signals in vertical and horizontal polarizations across the plurality of frequency bands in the range of DC to 300 GHz).

At operation 404, band-specific filtering operation may be applied to the received RF signals to obtain filtered RF signals. The plurality of band filters 212 may be configured to apply the band-specific filtering operation to the received RF signals to obtain the filtered RF signals. The operation 404 may include one or more sub-operations, such as operations 404A to 404C.

At operation 404A, the received RF signals may be processed via the first band filter 212A in a first frequency range. At operation 404B, the received RF signals may be processed via the second band filter 212B in a second frequency range, where the second frequency range may be higher than the first frequency range. At operation 404C, the received RF signals may be processed via the third band filter 212C in a third frequency range, where the third frequency range may be higher than the second frequency range. In an example, the first frequency range may be 1 hertz (Hz) to 1 GHz, the second frequency range may be 1.1 to 3 GHz, and the third frequency range may be between 3.1 GHz to 300 GHz. In another example, the first frequency range may be 50 MHz to 2.2 GHz, the second frequency range may be 2.4 GHz to 7 GHz, and the third frequency range may be between 7.2 GHz to 300 GHz.

At operation 406, the filtered RF signals may be converted to one or more intermediate frequencies (IFs). The circuitry 246 may be configured to convert the filtered RF signals to one or more intermediate frequencies (IFs) (e.g. in analog form). In an implementation, the local oscillator generator 214 may be configured to generate one or more tunable local oscillator frequencies above the threshold frequency (e.g., 9.8 GHz). A frequency shifting operation may be executed in one or more frequency conversion stages in which one or more tuned local oscillator frequencies above the threshold frequency may be injected at the circuitry 246 to push image frequencies above the threshold frequency and shift the filtered RF signals to defined intermediate frequencies. In another implementation, the mixer 216 may be configured to mix the filtered RF signals with an offset frequency (direct mixing) to convert the filtered RF signals to the intermediate frequencies. The conversion is explained in detail, for example, in FIG. 2. The control from operation 406 may pass to 408A and 408B. The operations 408A and 408B may be performed concurrently or may be performed at different times and sequences without limiting the scope of the disclosure.

At operation 408A, the filtered RF signals at the one or more IFs may be digitized to obtain digitized IF signals. One or more ADCs, such as the ADC arrays 226, may be configured to convert the filtered RF signals at the defined intermediate frequencies into digital form (e.g., for baseband processing) to obtain digitized IF signals. In an implementation, the circuitry 246 may be coupled to or may include the one or more ADCs.

At operation 408B, a sequence of offset frequencies may be generated, where each offset frequency in the sequence of offset frequencies may differ from adjacent offset frequencies by a defined frequency drift value. The local oscillator generator 214 may be configured to generate the sequence of offset frequencies.

At operation 410, a plurality of spectrum measurements may be executed for the digitized IF signals. Each spectrum measurement of the plurality of spectrum measurements may be based on a different offset frequency of the sequence of offset frequencies. Each spectrum measurement may be associated with a first frequency resolution. The processor 230 may be configured to execute the plurality of spectrum measurements for the digitized IF signals.

At operation 412, phase coherence information may be stored for each spectrum measurement of the plurality of spectrum measurements. The processor 230 may be configured to store the phase coherence information for each spectrum measurement of the plurality of spectrum measurements in memory buffers in the memory 234. The control may pass from operation 412 of FIG. 4A to operation 414 of FIG. 4B. FIG. 4B describes operations 414 to 422.

At operation 414, the plurality of spectrum measurements may be combined based on the stored phase coherence information to generate a spectrum analysis output with a second frequency resolution (e.g., an improved resolution) that exceeds the first frequency resolution. The processor 230 may be further configured to combine the plurality of spectrum measurements combined based on the stored phase coherence information. In an implementation, the operation 414 may include one or more sub-operations, such as operations 414A, 414B, and 414C. At operation 414A, a phase correction may be applied to each spectrum measurement of the plurality of spectrum measurements to obtain a plurality of phase-corrected spectrum measurements. At operation 414B, a weighted summation of the plurality of phase-corrected spectrum measurements may be performed to generate a combined spectrum measurement. At operation 414C, the combined spectrum measurement may be normalized to obtain the spectrum analysis output.

At operation 416, multi-link operation (MLO) parameters may be adjusted in the wireless communication device 104A. The processor 230 may be further configured to adjust the MLO parameters in the wireless communication device 104A.

At operation 418, the digitized IF signals in a first intermediate frequency band and a second intermediate frequency band may be concurrently processed based on the adjusted MLO parameters in the wireless communication device 104A. The processor 230 may be further configured to concurrently process the digitized IF signals in the first intermediate frequency band and the second intermediate frequency band based on the adjusted MLO parameters in the wireless communication device 104A.

At operation 420, a cross-band correlation may be performed between the processed digitized IF signals from the first intermediate frequency band and the second intermediate frequency band to identify related signal patterns. The processor 230 may be further configured to perform the cross-band correlation.

At operation 422, a trained ANN model 232 may be applied on the spectrum analysis output to identify recurring signal patterns. The processor 230 may be further configured to apply the trained ANN model 232 on the spectrum analysis output to identify recurring signal patterns. In an example, the identification of the recurring signal patterns may occur at each event of the cross-band correlation. The control may pass from operation 422 of FIG. 4B to operation 424 of FIG. 4C. FIG. 4C describes operations 424 to 426.

At operation 424, signals in the spectrum analysis output may be classified based on the identified recurring signal patterns. The classified signals may include legitimate signal communications, potential jamming signals, frequency hopping transmissions, or unknown or anomalous signals tagged for further analysis. Alternatively, and additionally, the detected signals may be classified based on the cross-band correlation. The processor 230 may be further configured to classify the signals in the spectrum analysis output based on the identified recurring signal patterns.

At operation 426, the wireless communication device 104A may be controlled to trigger an operational response based on the classified signals and the cross-band correlation. The processor 230 may be further configured to control the wireless communication device 104A to trigger an operational response based on the classified signals and the cross-band correlation.

Various embodiments of the disclosure may provide the wireless communication device 104A. The wireless communication device 104A may include the one or more antenna arrays 204 configured to receive RF signals across a plurality of frequency bands. The wireless communication device 104A may further include the plurality of band filters 212 configured to apply band-specific filtering operation to the received RF signals to obtain filtered RF signals. The wireless communication device 104A may further include circuitry (e.g., the circuitry 246) configured to convert the filtered RF signals to one or more intermediate frequencies (IFs) and digitize the filtered RF signals at the one or more IFs to obtain digitized IF signals. The wireless communication device 104A may further include the processor 230 configured to execute a plurality of spectrum measurements for the digitized IF signals, where each spectrum measurement of the plurality of spectrum measurements is based on a different offset frequency of a sequence of offset frequencies, and where each spectrum measurement is associated with a first frequency resolution. The processor 230 may be further configured to store phase coherence information for each spectrum measurement of the plurality of spectrum measurements. The processor 230 may be further configured to combine the plurality of spectrum measurements based on the stored phase coherence information to generate a spectrum analysis output with a second frequency resolution that exceeds the first frequency resolution.

Various embodiments of the disclosure may provide a computer program product for enhanced resolution spectrum monitoring, the computer program product including a non-transitory computer-readable storage medium having program instructions embodied therewith, the program instructions are executable by a system (e.g., the system 100) to cause the system to execute operations, the operations including receiving radio frequency (RF) signals across a plurality of frequency bands. The operations may further include applying a band-specific filtering operation to the received RF signals to obtain filtered RF signals. The operations may further include converting the filtered RF signals to one or more intermediate frequencies (IFs) and digitizing the filtered RF signals at one or more IFs to obtain digitized IF signals. The operations may further include executing a plurality of spectrum measurements for the digitized IF signals, where each spectrum measurement of the plurality of spectrum measurements is based on a different offset frequency of a sequence of offset frequencies, and where each spectrum measurement is associated with a first frequency resolution. The operations may further include storing phase coherence information for each spectrum measurement of the plurality of spectrum measurements. The operations may further include combining the plurality of spectrum measurements based on the stored phase coherence information to generate a spectrum analysis output with a second frequency resolution that exceeds the first frequency resolution.

While various embodiments described in the present disclosure have been described above, it should be understood that they have been presented by way of example, and not limitation. It is to be understood that various changes in form and detail can be made therein without departing from the spirit and scope of the present disclosure. In addition to using hardware (e.g., within or coupled to a central processing unit ("CPU"), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in computer-readable storage medium such as a non-transitory computer-readable medium configured to store the software. Such software can enable, for example, the function, fabrication, modeling, simulation, description and/or testing of the apparatus and methods described herein. For example, the software can be accomplished using general program languages (e.g., C, C++), hardware description languages (HDL) including Verilog HDL, VHDL, and so on, or other available programs. Such software can be disposed of in any known computer-readable storage medium such as non-transitory computer-readable medium, such as semiconductor, magnetic disc, or optical disc (e.g., CD-ROM, DVD-ROM, etc.). The software may be provided as computer data embodied in a computer-readable storage medium such as non-transitory computer-readable transmission medium (e.g., solid state memory any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the Internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments but should be defined only in accordance with the following claims and their equivalents.

Various aspects of the present disclosure are described by narrative text, flowcharts, diagrams of computer systems and/or diagrams of the machine logic included in various computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated operation, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer-readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer-readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation, or garbage collection, but this does not render the storage device as transitory because the data is not transitory while it is stored.

What is claimed is:

1. A wireless communication device, comprising:
- one or more antenna arrays configured to receive radio frequency (RF) signals across a plurality of frequency bands;
- a plurality of band filters configured to apply band-specific filtering operation to the received RF signals to obtain filtered RF signals;
- circuitry configured to:
  - convert the filtered RF signals to one or more intermediate frequencies (IFs) to obtain IF signals; and
  - digitize the IF signals at the one or more IFs to obtain digitized IF signals; and
- a processor configured to:
  - execute a plurality of spectrum measurements for the digitized IF signals, wherein
  - each spectrum measurement of the plurality of spectrum measurements is based on a different offset frequency of a sequence of offset frequencies, and
  - the each spectrum measurement is associated with a first frequency resolution;
- store phase coherence information for the each spectrum measurement of the plurality of spectrum measurements based on the different offset frequency of the sequence of offset frequencies; and
- combine the plurality of spectrum measurements based on the stored phase coherence information to generate a spectrum analysis output with a second frequency resolution, wherein the second frequency resolution exceeds the first frequency resolution.

2. The wireless communication device of claim 1, further comprising a mixer configured to mix the filtered RF signals with each offset frequency from the sequence of offset frequencies to convert the filtered RF signals to the IFs.

3. The wireless communication device of claim 1, further comprising a local oscillator generator configured to generate the sequence of offset frequencies, wherein each offset frequency in the sequence of offset frequencies differs from adjacent offset frequencies by a defined frequency drift value.

4. The wireless communication device of claim 3, wherein the local oscillator generator is further configured to dynamically adjust the defined frequency drift value based on signal characteristics in the spectrum analysis output.

5. The wireless communication device of claim 1, wherein the processor is further configured to apply a phase correction to the each spectrum measurement of the plurality of spectrum measurements to obtain a plurality of phase-corrected spectrum measurements.

6. The wireless communication device of claim 5, wherein the processor is further configured to perform a weighted summation of the plurality of phase-corrected spectrum measurements to generate a combined spectrum measurement.

7. The wireless communication device of claim 6, wherein the processor is further configured to normalize the combined spectrum measurement to obtain the spectrum analysis output.

8. The wireless communication device of claim 1, wherein the one or more antenna arrays comprises a plurality of dual-polarized antennas configured to capture the RF signals in vertical and horizontal polarizations across the plurality of frequency bands in a range of direct current (DC) to 300 gigahertz (GHz).

9. The wireless communication device of claim 1, wherein the plurality of band filters comprises:
- a first band filter configured to process the received RF signals in a first frequency range;
- a second band filter configured to process the received RF signals in a second frequency range, wherein the second frequency range is higher than the first frequency range; and
- a third band filter configured to process the received RF signals in a third frequency range, wherein the third frequency range is higher than the second frequency range.

10. The wireless communication device of claim 1, wherein the processor is further configured to:
- adjust multi-link operation (MLO) parameters in the wireless communication device; and
- concurrently process the digitized IF signals in a first IF band and a second IF band corresponding to the IFs, based on the adjusted MLO parameters in the wireless communication device.

11. The wireless communication device of claim 10, wherein the processor is further configured to perform a cross-band correlation between the processed IF signals from the first IF band and the second IF band.

12. The wireless communication device of claim 1, wherein the processor is further configured to execute a trained artificial neural network model on the spectrum analysis output to identify recurring signal patterns.

13. The wireless communication device of claim 12, wherein the processor is further configured to classify signals in the spectrum analysis output based on the identified recurring signal patterns, wherein the classified signals comprise one or more of: legitimate signal communications, potential jamming signals, frequency hopping transmissions, unknown signals, or anomalous signals.

14. A method for enhanced resolution spectrum monitoring, the method comprising:
- in a wireless communication device:
  - receiving radio frequency (RF) signals across a plurality of frequency bands;
  - applying band-specific filtering operation to the received RF signals to obtain filtered RF signals;
  - converting the filtered RF signals to one or more intermediate frequencies (IFs) to obtain IF signals;
  - digitizing the IF signals at the one or more IFs to obtain digitized IF signals;
  - executing a plurality of spectrum measurements for the digitized IF signals, wherein
    - each spectrum measurement of the plurality of spectrum measurements is based on a different offset frequency of a sequence of offset frequencies, and the each spectrum measurement is associated with a first frequency resolution;

storing phase coherence information for the each spectrum measurement of the plurality of spectrum measurements based on the different offset frequency of the sequence of offset frequencies; and combining the plurality of spectrum measurements based on the stored phase coherence information to generate a spectrum analysis output with a second frequency resolution, wherein the second frequency resolution exceeds the first frequency resolution.

15. The method of claim 14, further comprising mixing the filtered RF signals with each offset frequency from the sequence of offset frequencies to convert the filtered RF signals to the IFs.

16. The method of claim 14, further comprising generating the sequence of offset frequencies, wherein each offset frequency in the sequence of offset frequencies differs from adjacent offset frequencies by a defined frequency drift value.

17. The method of claim 14, further comprising applying a phase correction to the each spectrum measurement of the plurality of spectrum measurements to obtain a plurality of phase-corrected spectrum measurements.

18. The method of claim 17, further comprising performing a weighted summation of the plurality of phase-corrected spectrum measurements to generate a composite spectrum measurement.

19. The method of claim 18, further comprising normalizing the composite spectrum measurement to obtain the spectrum analysis output.

20. A computer program product for enhanced resolution spectrum monitoring, the computer program product comprising a non-transitory computer-readable storage medium having program instructions embodied therewith, the program instructions are executable by a system to cause the system to execute operations, the operations comprising:

receiving radio frequency (RF) signals across a plurality of frequency bands;

applying band-specific filtering operation to the received RF signals to obtain filtered RF signals;

converting the filtered RF signals to one or more intermediate frequencies (IFs) to obtain IF signals;

digitizing the IF signals at the one or more IFs to obtain digitized IF signals;

executing a plurality of spectrum measurements for the digitized IF signals, wherein each spectrum measurement of the plurality of spectrum measurements is based on a different offset frequency of a sequence of offset frequencies, and the each spectrum measurement is associated with a first frequency resolution;

storing phase coherence information for the each spectrum measurement of the plurality of spectrum measurements based on the different offset frequency of the sequence of offset frequencies; and combining the plurality of spectrum measurements based on the stored phase coherence information to generate a spectrum analysis output with a second frequency resolution, wherein the second frequency resolution exceeds the first frequency resolution.

* * * * *